United States Patent [19]
Rhodes

[11] Patent Number: 5,390,129
[45] Date of Patent: Feb. 14, 1995

[54] UNIVERSAL BURN-IN DRIVER SYSTEM AND METHOD THEREFOR

[75] Inventor: James V. Rhodes, Chandler, Ariz.

[73] Assignee: Motay Electronics, Inc., Chandler, Ariz.

[21] Appl. No.: 908,968

[22] Filed: Jul. 6, 1992

[51] Int. Cl.⁶ ............................................. G06F 15/20
[52] U.S. Cl. .................... 364/480; 364/580; 371/23; 324/158.1; 324/765
[58] Field of Search ........... 324/158 F, 158 R, 158 T, 324/158 P; 364/488, 489, 490, 491, 578, 579, 580, 480; 371/23

[56] References Cited

U.S. PATENT DOCUMENTS

| | | | |
|---|---|---|---|
| 4,070,565 | 1/1978 | Borrelli | 364/580 |
| 4,168,527 | 9/1979 | Winkler | 364/580 |
| 4,363,105 | 12/1982 | Plassmeier | 364/580 |
| 4,493,045 | 1/1985 | Hughes, Jr. | 364/579 |
| 4,622,647 | 11/1986 | Sagnard et al. | 364/580 |
| 4,637,020 | 1/1987 | Schinabeck | 364/579 |
| 4,706,208 | 11/1987 | Helms | 364/580 |
| 4,799,021 | 1/1989 | Cozzi | 324/158 F |
| 4,866,714 | 9/1989 | Adams et al. | 371/22.1 |
| 4,902,969 | 2/1990 | Gussman | 324/158 F |
| 4,928,278 | 5/1990 | Otsuji et al. | 364/579 |
| 5,126,656 | 6/1992 | Jones | 324/158 F |

*Primary Examiner*—Emanuel T. Voeltz
*Assistant Examiner*—Jae H. Choi
*Attorney, Agent, or Firm*—Harry M. Weiss

[57] ABSTRACT

An improved driver system and method therefor for the accelerated life testing of semiconductor devices is described in which a universal burn-in driver system which can be reconfigured by computer control is used to accomplish the efficient signal conditioning, testing and data collection for a wide variety of semiconductor devices with a minimum of system setups and change-overs. The ability of the driver system to be reconfigured by computer control allows at least one group of electronic devices of the same type and at least another group of electronic devices of a different type to be tested by the same burn-in driver without the necessity for mechanical change-over or the use of separate different driver board designs.

107 Claims, 17 Drawing Sheets

104

105

106

107

108

110

112

113

UNIVERSAL BURN-IN DRIVER SYSTEM AND METHOD THEREFOR

BACKGROUND OF THE INVENTION

1. Field of the Invention

This invention relates generally to testing of electronic components and more specifically to an improved system and method for the accelerated life testing of semiconductor devices in which a multi-purpose computer controlled driver system can accomplish the signal conditioning and testing of a wide variety of devices quickly and efficiently with a minimum of system setups and change-overs.

2. Description of the Prior Art

Accelerated life testing of semiconductor devices is a process which electrically ages these devices in their final and packaged form to help find defects which would result in premature failure. Although a variety of electrical conditioning and testing procedures may be used, most processes use heat as an accelerator by applying temperature stress to bring a defective semiconductor device to its failure point more quickly. Because of this use of heat, the commonly used term to describe such procedures is "burn-in" and the associated equipments are called "burn-in" systems. The required heat may be externally generated by placing the semiconductor devices in an oven, or by placing a heat source physically in contact with the semiconductor device package. The heat may also be self generated by electrically conditioning (biasing) the device to an extreme electrical condition.

Burn-in procedures were originally developed to prove that semiconductor devices would not fail early on in their operating life cycle. A key factor in their use to improve the reliability of semiconductor devices was the statistical analyses of the operating life of a given type device. These analyses usually showed a higher rate of failure during an initial "infant mortality" phase of operating life, a greatly reduced and stable rate of failure during the "normal operation" phase of operating life and, finally, typically after many years of operation, a gradually increasing rate of failure during the final "wear-out" phase of operating life. A further key factor was the statistical finding that "infant mortality" type failures could be caused to occur more quickly ("accelerated") through the use of heat and electrical over-stress. Thus failures of defective devices which might take months or years to occur under normal conditions could be caused to occur in just a few hours under burn-in conditions while non-defective devices were unaffected.

During the initial phases of the development of semiconductor devices, burn-in was widely used on products which had stringent reliability requirements to empirically demonstrate that the devices had survived the infant mortality phase of operation and were therefore reliable. Thus most semiconductor manufacturers have integrated burn-in into many of their intermediate manufacturing processes as well as a final test before shipment to a customer. As knowledge about the root causes of semiconductor device failure has increased and as the nature of the semiconductor manufacturing process has evolved to eliminate these root causes, the overall reliability of semiconductor devices has greatly improved. This improvement in reliability has occurred in a wide range of semiconductor devices including analog or linear devices and digital logic, memory or microprocessor devices and has resulted in changes in the way in which semiconductor manufacturers make use of their burn-in facilities. Instead of empirically confirming reliability by "burning-in" large quantities of the same device, manufacturers are using burn-in facilities to generate characterization and failure mode data on a wider variety of devices. By carefully controlling and recording the conditions which ultimately result in device failure and by performing thorough postmortem analyses to establish the precise root cause of each device failure, a statistical database can be created which allows continuing improvement in the design factors and the semiconductor processing steps used to make each device. These improvements in turn lead to still greater improvements in the overall quality and reliability in the semiconductor devices which have been analyzed and qualified through the "burn-in" process.

As a result of the above described increasing and crucial role of "burn-in" in the manufacture of reliable semiconductor devices, there exists a need for more sophisticated "burn-in" systems which make use of modular system elements which are readily reconfigured by computer control to accomplish the desired burn-in requirements and facilitate data collection and analysis for a wide variety of devices in a manner which is efficient and which requires a minimum of hardware reconfiguration.

OBJECTS OF THE INVENTION

Accordingly, it is an object of this invention to provide an improved system and method for the accelerated life testing of semiconductor devices.

It is a further object of this invention to provide an improved system and method for the accelerated life testing of semiconductor devices which uses a multi-purpose computer controlled driver system.

It is a further object of this invention to provide an improved system and method for the accelerated life testing of semiconductor devices which uses a multi-purpose computer controlled driver system to accomplish the signal conditioning and testing of a multiplicity of semiconductor devices including analog or linear devices and digital logic, memory or microprocessor devices.

It is a further object of this invention to provide an improved system and method for the accelerated life testing of semiconductor devices which uses a multi-purpose computer controlled driver system to accomplish the signal conditioning and testing of a multiplicity of semiconductor devices and which uses a graphically based software operating system to accomplish said testing quickly and efficiently with a minimum of system setups and change-overs.

SUMMARY OF THE INVENTION

According to the foregoing objectives, this invention describes an improved driver system and method therefor for the accelerated life testing of semiconductor devices in which a menu based software operating system and multiple purpose computer control are used to accomplish the efficient signal conditioning, testing and data collection for a wide variety of semiconductor devices with a minimum of system setups and change-overs.

DETAILED DESCRIPTION

Figure 1:
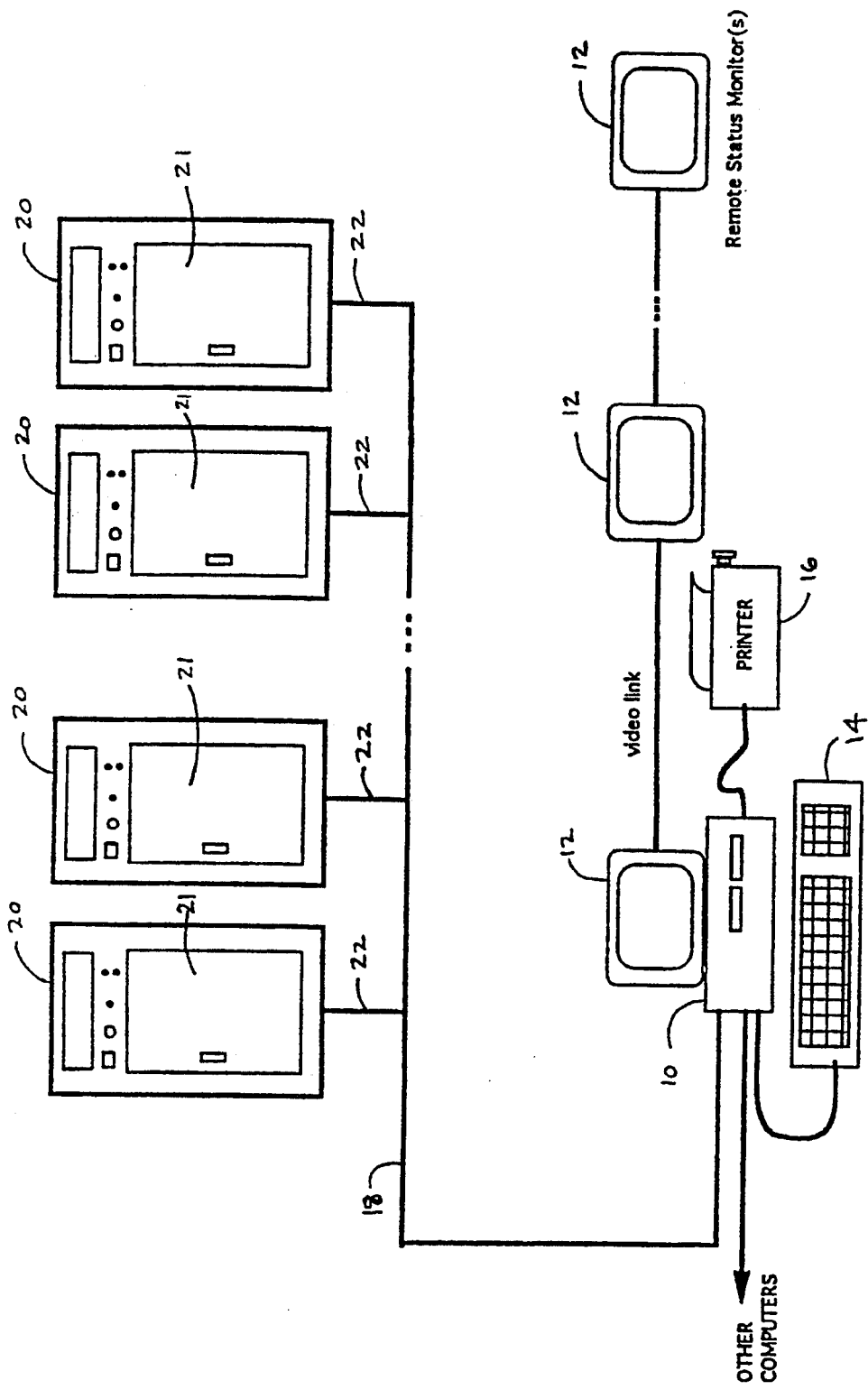
FIG. 1 is a pictorial block diagram of a computer controlled burn-in system.

FIG. 1 shows a pictorial block diagram of a computer-controlled burn-in system which forms a typical environment for the universal driver system of the present invention. In this system, a main computer 10 having a monitor 12, input keyboard 14 and printer 16 form the central control element for the system. A data bus 18 forms an input-output data link to a multiplicity of burn-in ovens 20 with each oven having a data port 22 which provides two-way access to data bus 18. Each of the burn-in ovens 20 is an environmental testing chamber adapted to contain a number of circuit boards (commonly called "burn-in boards") each of which can house a number of electronic devices such as integrated circuits. The interior of burn-in oven 20 is accessed through door 21. Each burn-in oven has its own monitoring display 24 and manual and automatic controls 26. Associated with each of the burn-in ovens 20 but not shown are a multiplicity of the universal driver modules of the present invention which will be described in detail in the descriptions which follow.

Figure 2:
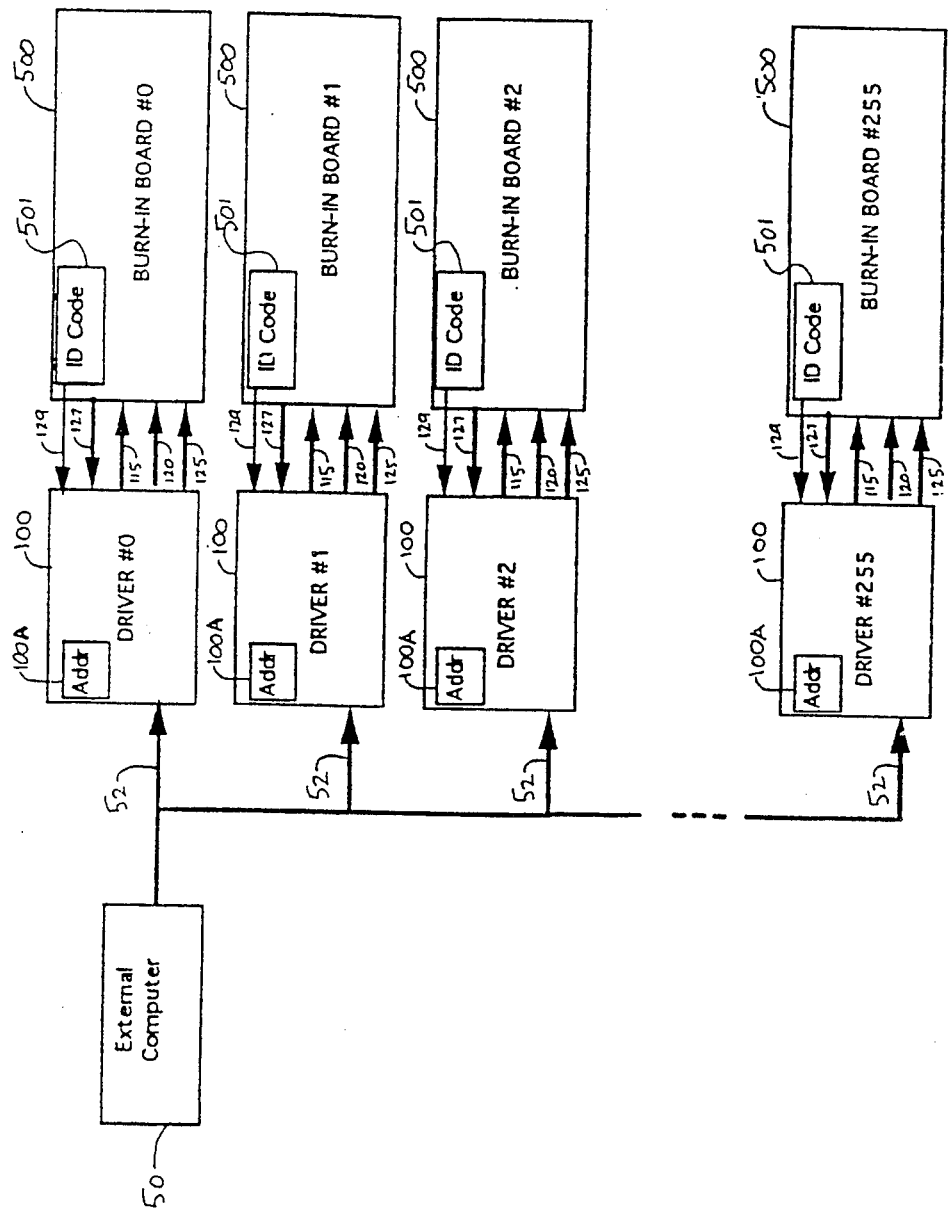
FIG. 2 is a simplified block diagram of a computer controlled burn-in system which incorporates universal driver circuits according to the present invention.

FIG. 2 is a simplified block diagram of a computer controlled burn-in system which incorporates universal driver systems according to the present invention. In FIG. 2, an external computer 50 is coupled to a plurality of universal driver systems 100 via computer bus 52. Each of the universal driver systems 100 is coupled to a burn-in board 500 by a plurality of input and output signal paths which provide the required digital and analog signals to properly control, exercise and monitor the devices under test (DUT's) that are mounted on the burn-in board as will be described in detail in the descriptions which follow. Output signal paths which couple from each of the universal driver systems 100 to a burn-in board 500 include power bus 115, analog bus 120 and vector/monitor bus 125. Input signal paths which couple from each burn-in board 500 to a universal driver system 100 include DUT monitors bus 127 and automatic programming bus 129. Each burn-in board 500 also includes an identification code means 501 which couples to the associated driver system 100 via automatic programming bus 129. Identification code means 501 allows each burn-in board 500 to be uniquely identified by external computer 50 so that particular sets of stored instructions and data can be loaded into a particular driver system 100 of the present invention. These sets of stored instructions and data cause the reconfiguring of the electrical properties of the driver system 100 appropriate for the particular devices under test that are installed in the particular burn-in board 500 which is coupled to the driver system 100. Thus the electrical properties of the driver system 100 of the present invention can be changed by software control to meet the requirements of the particular devices under test that are installed in the particular burn-in board 500 which is coupled to the driver system 100 without any hardware change or reconfiguration as would be required for prior art driver systems. Further, these changes by software control can be accomplished remotely via external computer 50 without physical manipulation of the driver system 100 or of the associated burn-in board 500. These capabilities offer unique advantages over prior art driver systems because a single "universal" driver system can be used for a wide variety of different types of devices under test in a variety of test conditions by simply changing the set of software instruction which configure and control the driver system. Using a "universal" driver system according to the present invention thus improves over prior art systems by reducing the costs associated with having many different type drivers each dedicated to a single device type and improving efficiency since a single "universal" driver system design is cheaper to manufacture and sell due to economies of scale and easier to operate and maintain since inventory and training are simplified.

Turning again to FIG. 2, computer bus 52 is a bi-directional bus which comprises signal paths for address, control and data transmitted to and from external computer 50 and the plurality of universal driver modules 100. Each of the universal driver modules 100 contains high impedance computer interface circuitry (not shown) which allows large numbers of driver modules to be connected to computer bus 52 without degrading the transmitted or received signal levels. Each of the universal driver modules 100 also contains an address means 100A which is part of the computer interface circuitry. This address means allows driver programs and data which are "broadcast" to the plurality of driver modules 100 to be received only by the particular driver system for which it is intended. Thus the overall operation of the system of FIG. 2 is for the external computer 50 to identify a particular burn-in board 500 by reading the identification code means 501 which couples to it's associated driver system 100 via I.D. bus 502 and then to direct the particular set of stored instructions and data (hereafter called a "project") required to cause the reconfiguring of the electrical properties of the driver system 100 appropriate for the particular devices under test that are installed in the particular burn-in board 500 which was identified by the identification code means 501.

Figure 3:
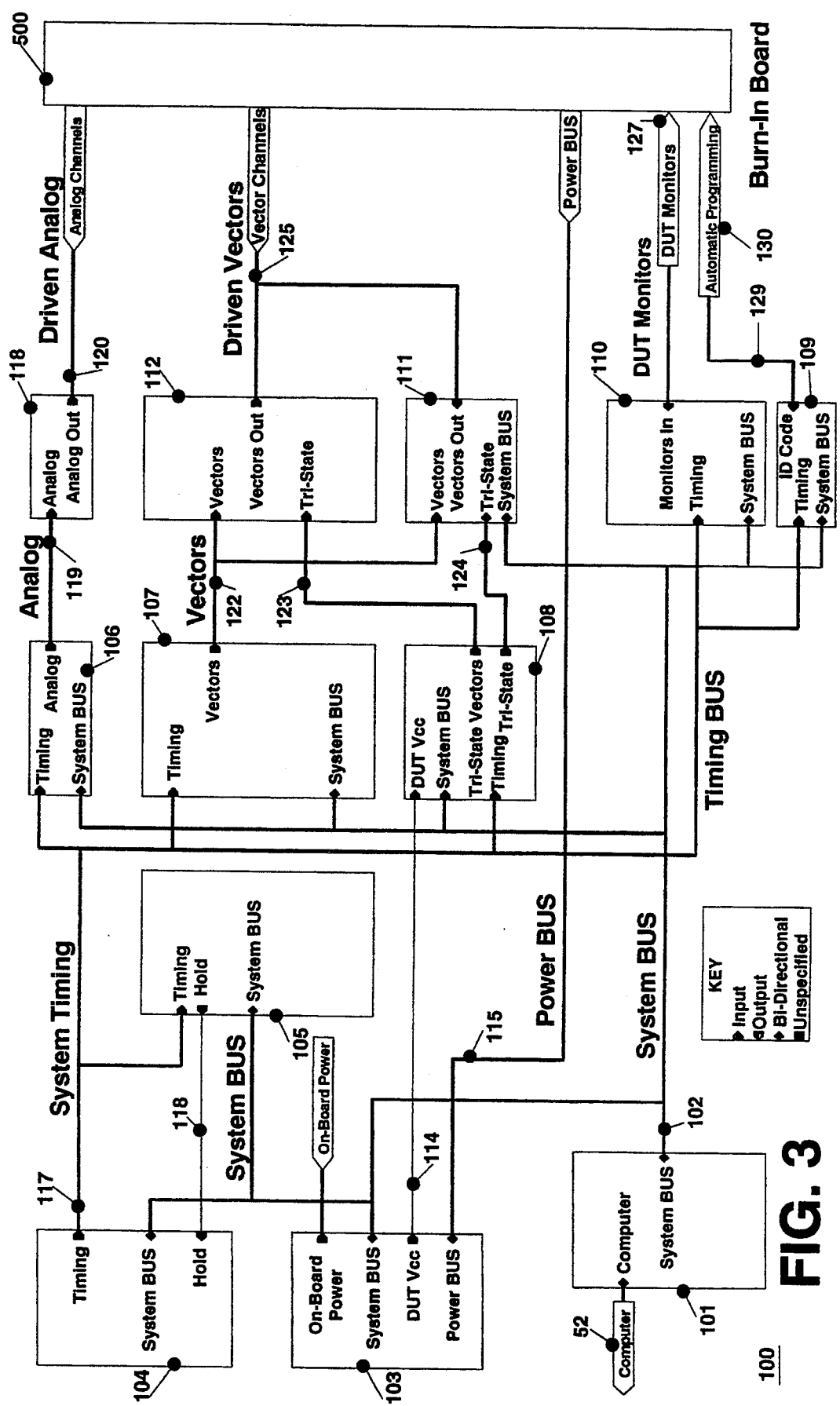
FIG. 3 is a generalized block diagram of the universal driver system of the present invention.
Figure 4:
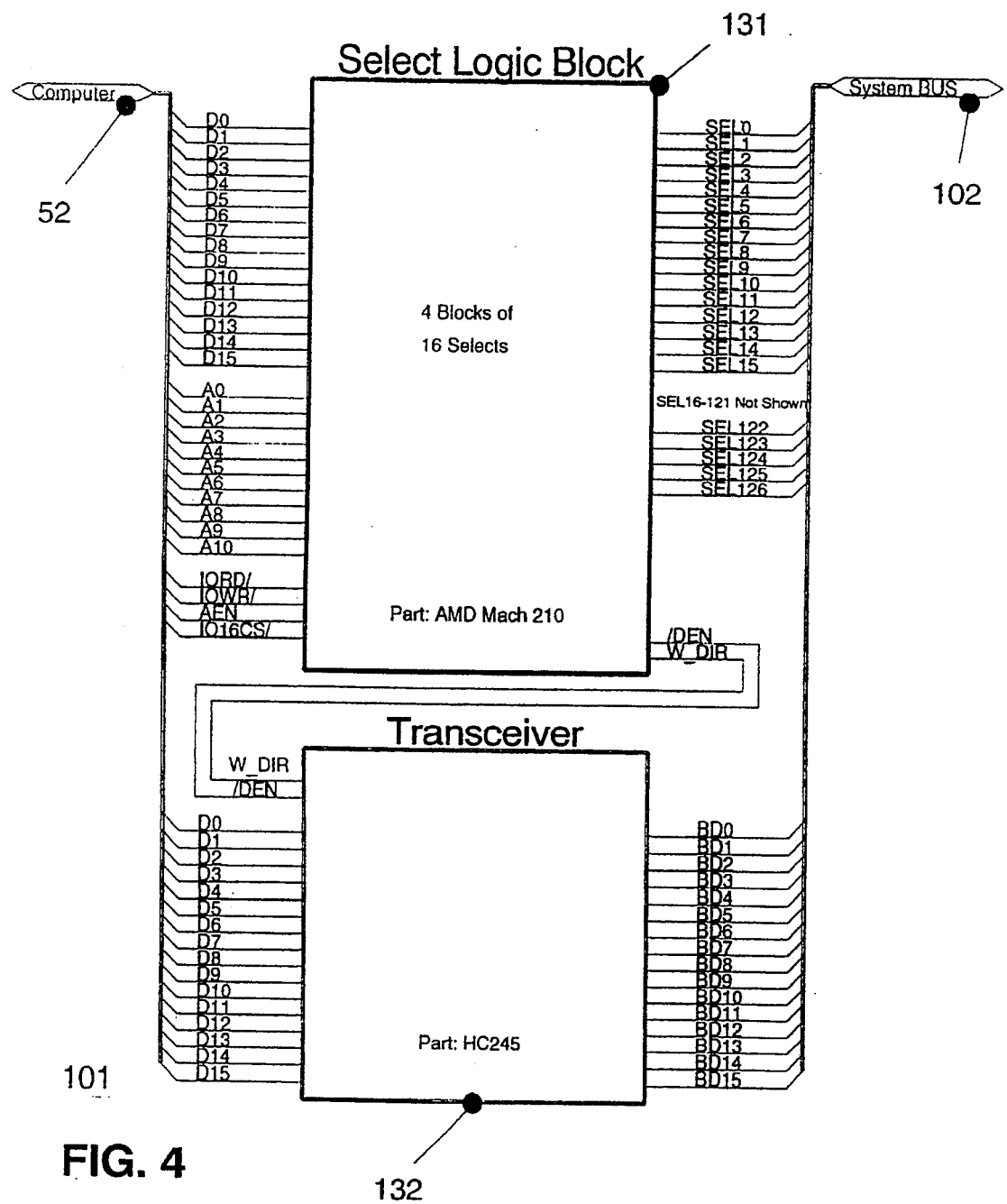
FIG. 4 is a block diagram of the computer interface module which is part of the universal driver system of the present invention.

FIG. 3 is a generalized block diagram of the universal driver system 100 of the present invention. In FIG. 3, a computer bus 52 (a bi-directional bus) couples from an external computer 50 (see FIG. 2) to computer interface module 101. Computer interface module 101 contains address logic circuitry which determines that driver data present on computer bus 52 is received by the correct one of a plurality of the universal driver system 100. Computer interface module 101 also contains the transceiver and select logic circuitry required to provide direction and control for data being transferred from external computer 50 to the particular modules which comprise universal driver system 100 and, conversely, for data being transferred from the particular modules which comprise universal driver system 100 to external computer 50. Additional information regarding the detailed structure and function of computer interface module 101 is provided in the discussion of FIG. 4 shown below. Computer interface module 101 is coupled to all of the plurality of other modules which make up universal driver system 100 of the present invention by system bus 102 (a bi-directional bus). System bus 102 comprises a plurality of signal paths for transmitting and receiving the data and control signals required to control and re-configure the other modules which make up universal driver system 100 of the present invention. Additional information regarding the detailed function of the particular conductors which comprise the plurality of signal paths in system bus 102 is provided in the discussion of FIG. 4 shown below. Thus system bus 102 couples to power management module 103, system timing generation module 104, vector hold module 105, analog generation module 106, vector storage module 107, tri-state control module 108, automatic programming module 109, DUT monitoring module 110, and on-board status monitoring module 111.

Figure 5:
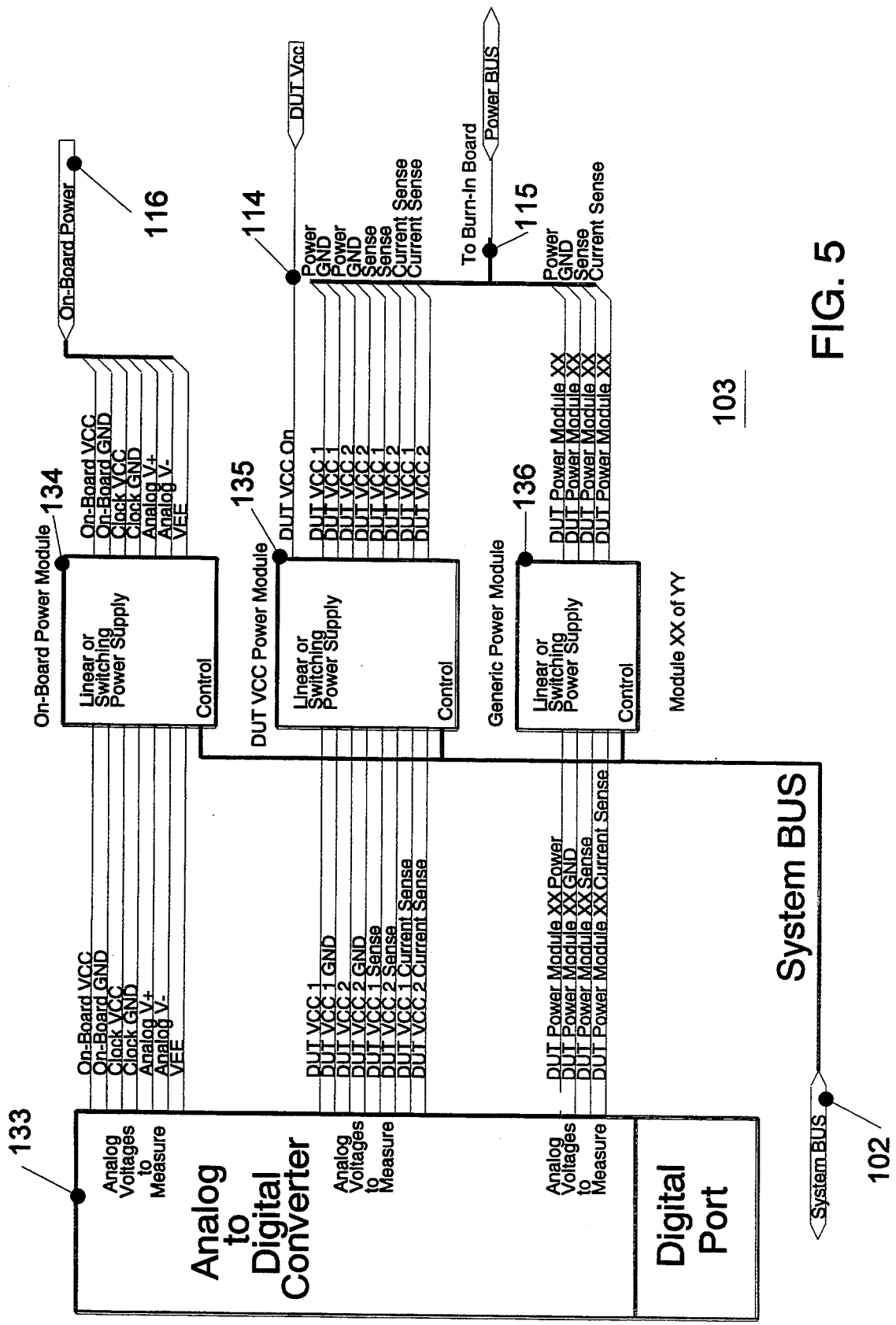
FIG. 5 is a block diagram of the power management module which is part of the universal driver system of the present invention.

Power management module 103 functions to measure and regulate the different voltages that are required by the individual modules that make up universal driver system 100 and by the particular burn-in board 500 with which it is associated. Additional information regarding the detailed structure and function of the particular circuit elements which provide these measurement and regulation functions is given in the discussion of FIG. 5 shown below. Power management module 103 is coupled to tri-state control module 108 by DUT Vcc "On" conductor 114 (an output conductor). Power management module 103 is also coupled to power bus 115 (a bi-directional bus) and on-board power bus 116 (a bi-directional bus). Power bus 115 provides regulated power to the particular burn-in board 500 which is associated with the universal driver system 100 of interest and is not used on the driver system 100 except to provide the point at which the driver system generates and monitors (measures) the voltage conditions existing on the burn-in board. On-board power bus 116 provides regulated power to the various modules which make up the universal driver system 100 so that all digital and analog circuits which are part of universal driver system 100 receive their power and precision references from this bus.

Figure 6:
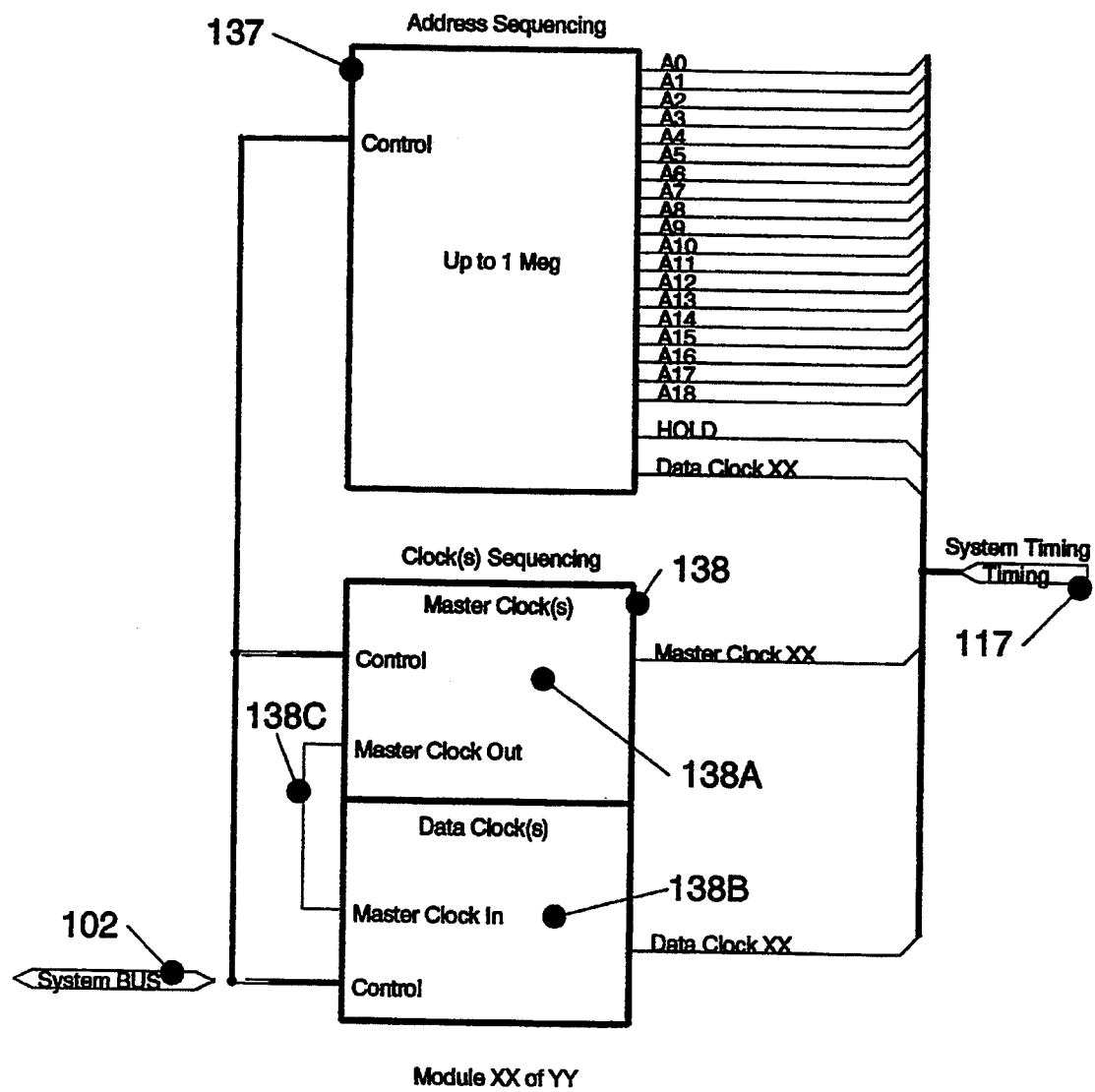
FIG. 6 is a block diagram of the system timing generation module which is part of the universal driver system of the present invention.

System timing generation module 104 provides programmable master and data clock signals required by the individual modules which comprise universal driver system 100. System timing generation module 104 also provides static and dynamic address sequencing signals to the static random access memory (SRAM) which is part of universal driver system 100. Additional information regarding the detailed structure and function of the particular circuit elements which provide these clock and address sequencing functions is given in the discussion of FIG. 6 shown below. The output of system timing generation module 104 is transmitted on system timing bus 117 (an output bus) which couples to vector hold module 105, analog generation module 106, vector storage module 107, tri-state control module 108, automatic programming module 109 and DUT monitoring module 110.

Figure 7:
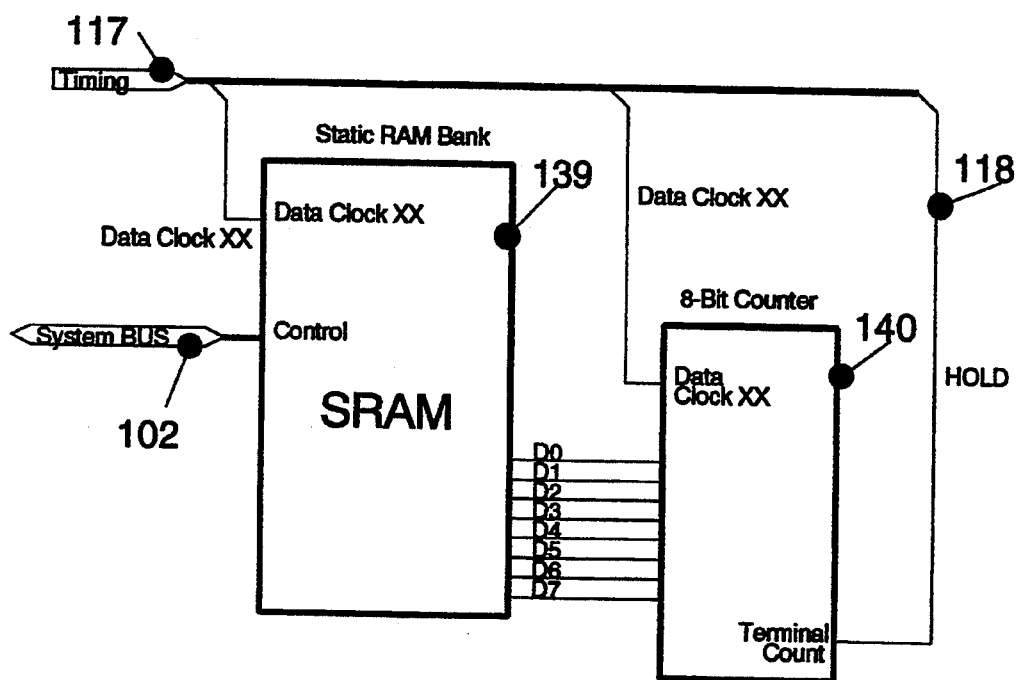
FIG. 7 is a block diagram of the vector hold module which is part of the universal driver system of the present invention.

Vector hold module 105 functions to extend the time interval of stored data patterns so that longer data sequences required to exercise devices under test can be generated without requiring additional memory. Additional information regarding the detailed structure and function of the particular circuit elements which provide these vector hold functions is given in the discussion of FIG. 7 shown below. The output of vector hold module 105 is produced on the hold signal path 118 (an output path) which couples to system timing generation module 104 which then imposes hold requirements via system timing bus 117.

Figure 8:
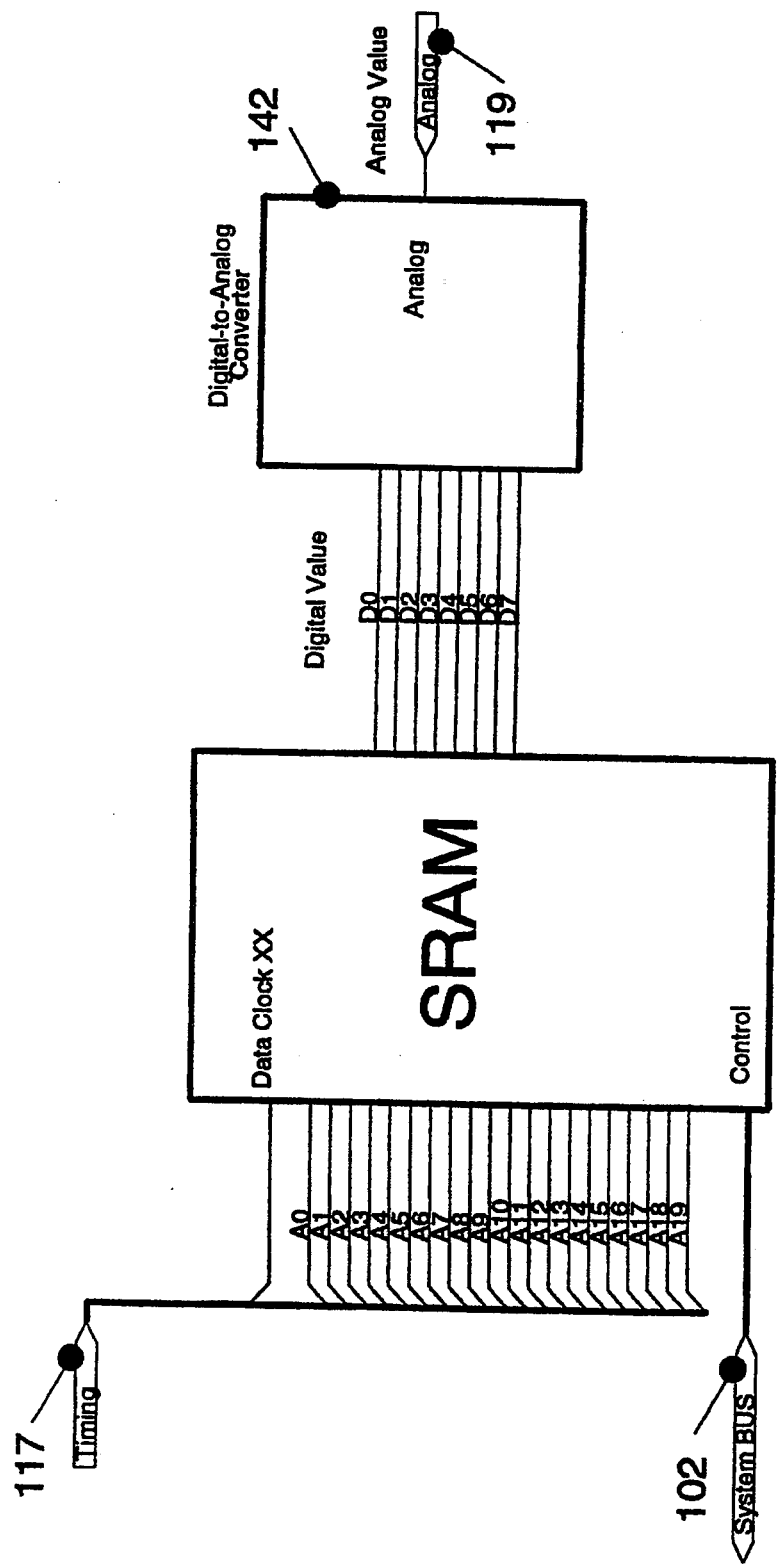
FIG. 8 is a block diagram of the analog generation module which is part of the universal driver system of the present invention.

Analog generation module 106 uses digital-to-analog converter (DAC) circuitry to generate a range of analog signals such as sine waves, square waves, ramp waves and the like based on programmed patterns transmitted from external computer 50. Additional information regarding the detailed structure and function of the particular circuit elements which provide these analog signals is given in the discussion of FIG. 8 shown below. The output of analog generation module 106 couples to analog driver module 113 via analog bus 119 (an output bus).

Figure 15:
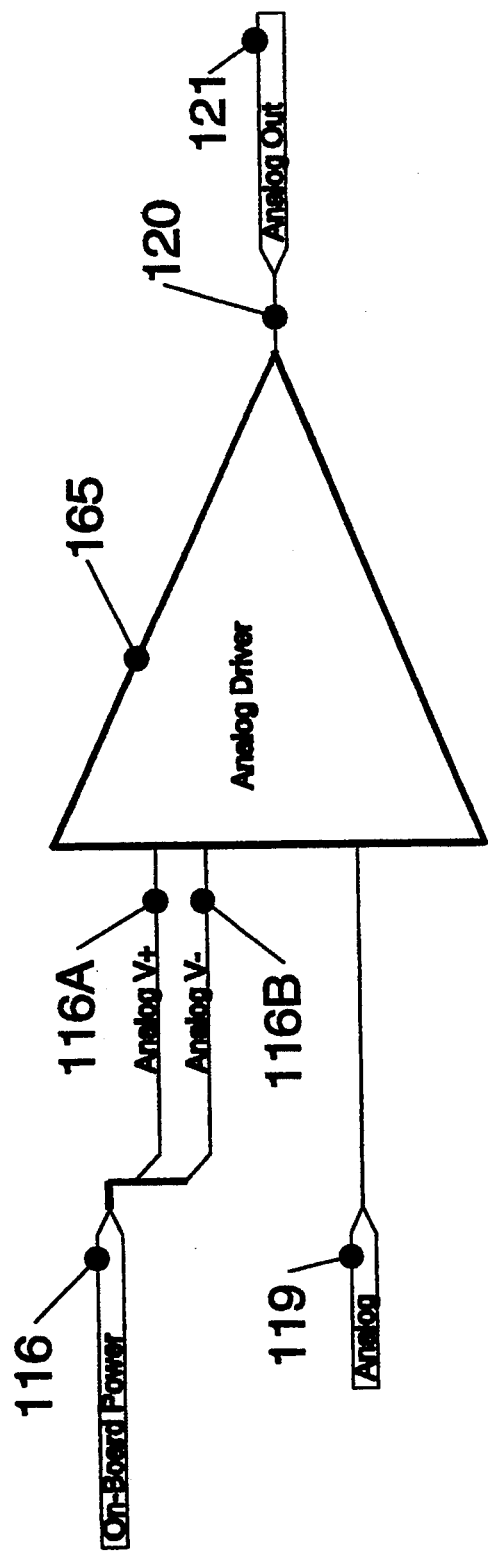
FIG. 15 is a block diagram of the analog driver module which is part of the universal driver system of the present invention.

Analog driver module 113 functions to provide additional current drive capability for the analog channels thereby allowing them to drive higher current loads. Additional information regarding the detailed structure and function of the particular circuit elements which provide this additional current drive capability is given in the discussion of FIG. 15 shown below. The output of analog driver module 113 couples to driven analog bus 120 (an output bus) which couples to the analog channels 121 which couple to the analog channel inputs of the burn-in board 500 (not shown) associated with this particular universal driver system 100.

Figure 9:
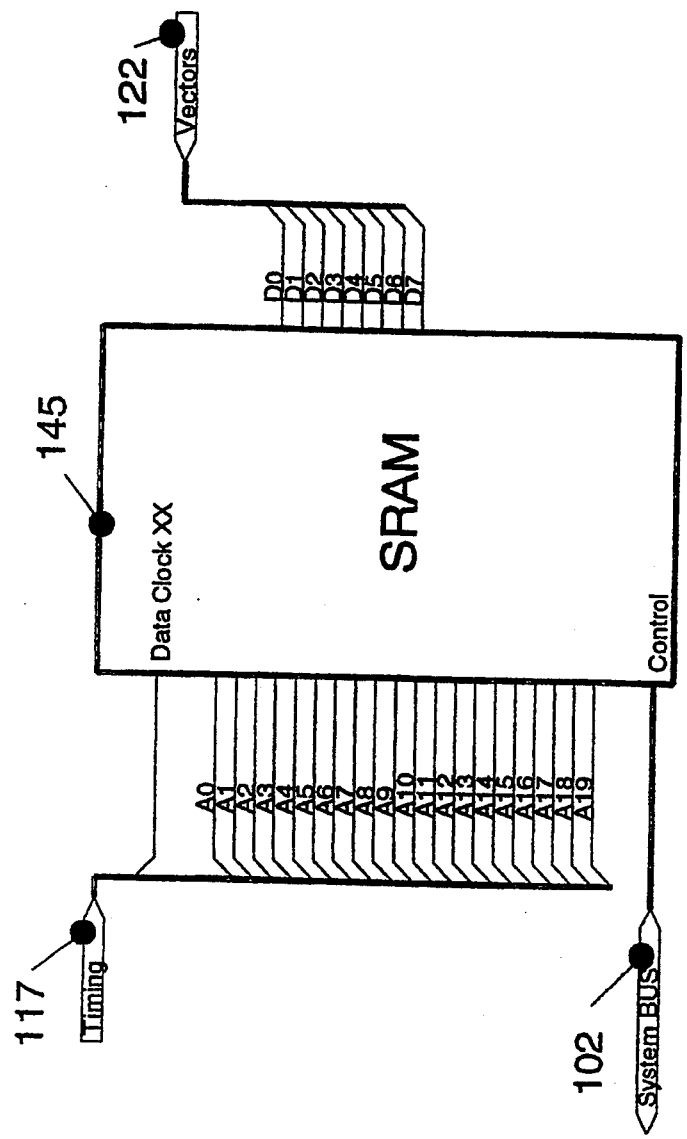
FIG. 9 is a block diagram of the vector storage module which is part of the universal driver system of the present invention.

Vector storage module 107 functions by using SRAM to provide the large digital storage area which retains the test data patterns ("vectors") which define the digital signals which will be applied to the devices under test (DUT's) which are housed in the burn-in board 500 associated with a particular universal driver system 100. Additional information regarding the detailed structure and function of the particular circuit elements which provide this additional vector storage capability is given in the discussion of FIG. 9 shown below. The output of vector storage module 107 couples to vectors bus 122 (an output bus) which in turn couples to on-board status monitoring module 111 and to output driver module 112.

Figure 10:
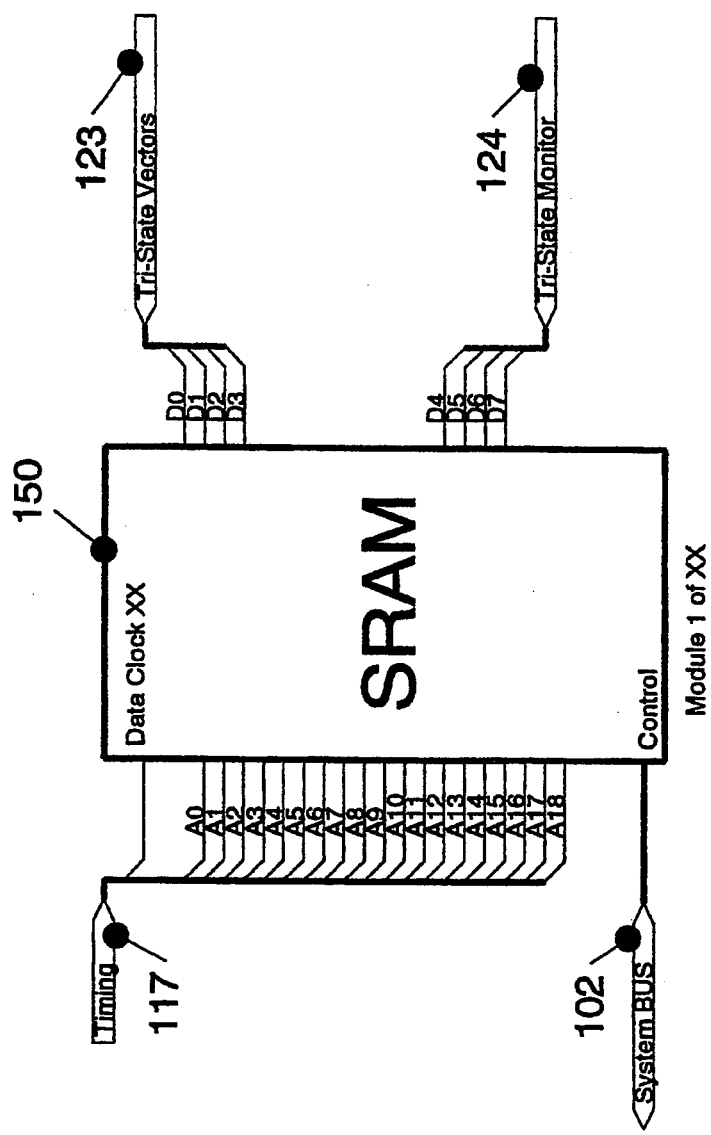
FIG. 10 is a block diagram of the tri-state control module which is part of the universal driver system of the present invention.

Tri-state control module 108 functions to provide an additional dimension of output driver control by allowing a particular output driver to be switched to a high-impedance or disconnected state in addition to the drivers normal ON (current sourcing) and normal OFF (current sinking) states. This additional capability allows greater application flexibility for the driver by allowing it to be configured in many different ways. Additional information regarding the detailed structure and function of the particular circuit elements which provide this additional tri-state control capability is given in the discussion of FIG. 10 shown below. Tri-state control module 108 produces one set of outputs on tri-state vectors bus 123 (an output bus) which couples to output driver module 112. Tri-state control module 108 produces a second set of outputs on tri-state bus 124 (an output bus) which couples to output driver module 112.

Figure 14:
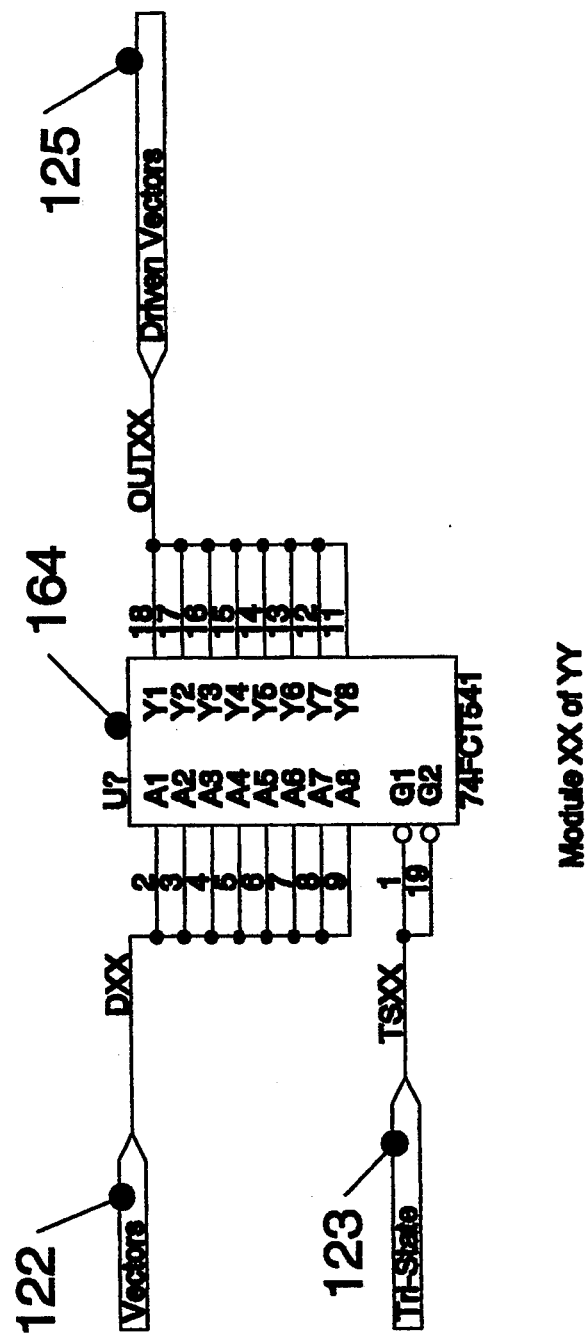
FIG. 14 is a block diagram of the output driver module which is part of the universal driver system of the present invention.

Output driver module 112 functions to provide additional current drive capability to the DUT's housed on the associated burn-in board 500 (not shown). Output driver module 112 also functions to allow universal driver system 100 to change the high level voltage (Voh) that is being applied to the DUT's housed on the associated burn-in board 500 (not shown). Additional information regarding the detailed structure and function of the particular circuit elements which provide this output driver capability is given in the discussion of FIG. 14 shown below. Output driver module 112 produces a set of outputs on driven vector bus 125 which couples to on-board status monitoring module 111 and to vector channels 126 which couple to the vector channel inputs of the burn-in board 500 (not shown) associated with this particular universal driver system 100.

Figure 13:
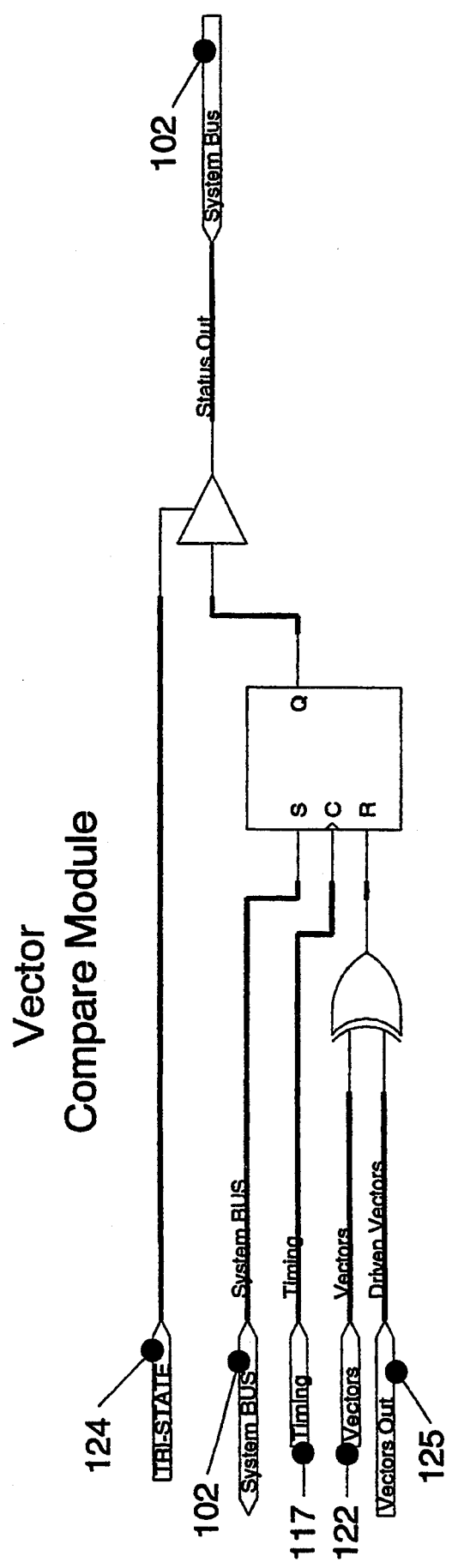
FIG. 13 is a block diagram of the on-board status monitoring module which is part of the universal driver system of the present invention.

On-board status monitoring module 111 functions to monitor for faults that may occur within the various module elements which comprise universal driver system 100. Additional information regarding the detailed structure and function of the particular circuit elements which provide this on-board status monitoring capability is given in the discussion of FIG. 13 shown below. On-board status monitoring module 111 is coupled to vectors bus 122 (an input bus), to driven vector bus 125 (an input bus), to tri-state bus 124 (a bi-directional bus) and to system bus 102 (a bi-directional bus).

Figure 12:
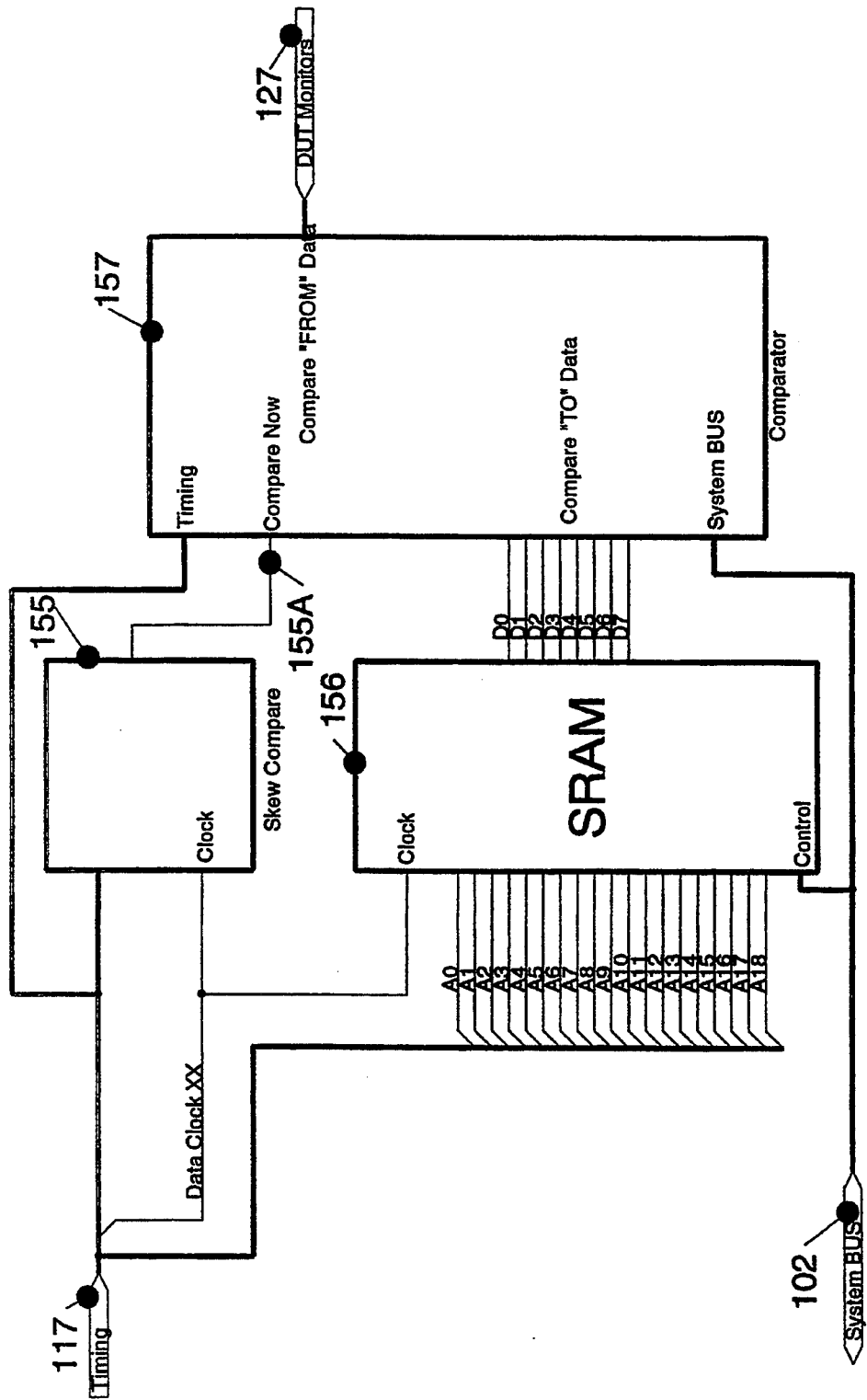
FIG. 12 is a block diagram of the DUT monitoring module which is part of the universal driver system of the present invention.

DUT monitoring module 110 functions to provide information about the operating condition of DUT's on the associated burn-in board 500 (not shown) to the external computer which is controlling and altering the operation of a particular universal driver system 100. This information is obtained by comparing data received from the DUT's on the associated burn-in board 500 with expected data (stored in SRAM by the external computer). When this comparison shows a difference, the information is passed to external computer 50 for datalogging. Additional information regarding the detailed structure and function of the particular circuit elements which provide this DUT monitoring capability is given in the discussion of FIG. 12 shown below.

DUT monitoring module 110 is coupled to DUT monitors bus 127 (an input bus) which in turn couples to the DUT monitors output channels on the associated burn-in board 500 (not shown). DUT monitoring module 110 also couples to system timing bus 117 (an input bus) and to system bus 102 (a bi-directional bus).

Figure 11:
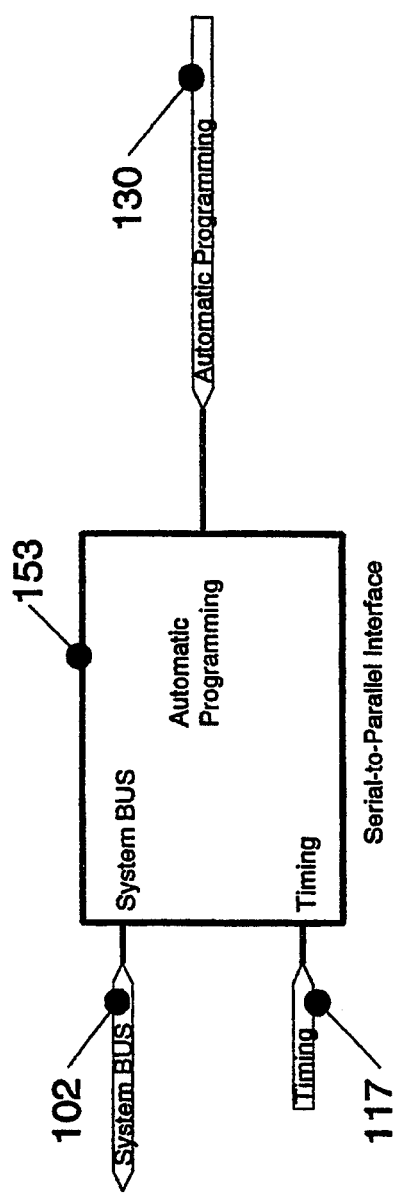
FIG. 11 is a block diagram of the automatic programming module which is part of the universal driver system of the present invention.

Automatic programing module 109 functions to provide a serial to parallel interface which translates the identification code which uniquely identifies a particular burn-in board 500 (not shown) that is associated with a universal driver system 100 to the external computer 50 as has been previously discussed. The designation "automatic" refers to the fact that various different types of burn-in boards 500 can be loaded into a burn-in chamber and the universal driver systems 100 associated with each of them will "automatically" recognize the identification code which uniquely identifies the particular burn-in board 500 and will then pass this code to external computer 50 over system bus 152 and computer bus 52 so that universal driver system 100 can be appropriately reconfigured by program without the need for human intervention to make changes on the driver system itself. Additional information regarding the detailed structure and function of the particular circuit elements which provide this automatic programing capability is given in the discussion of FIG. 11 shown below. Automatic programming module 109 couples to ID code bus 129 (an input bus) which is in turn coupled to the automatic programming channels 130 from the associated burn-in board 500 (not shown). Automatic programming module 109 also couples to system timing bus 117 (an input bus) and to system bus 102 (a bi-directional bus).

Figure 16:
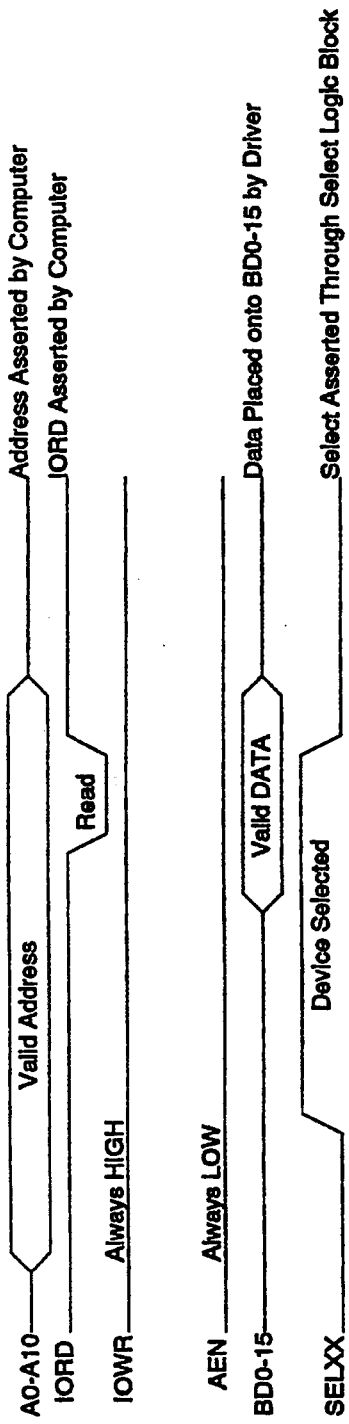
FIG. 16 is a timing diagram showing the time relationships of signals used for input-output read and input-output write operations of the universal driver system of the present invention.
Figure 16:
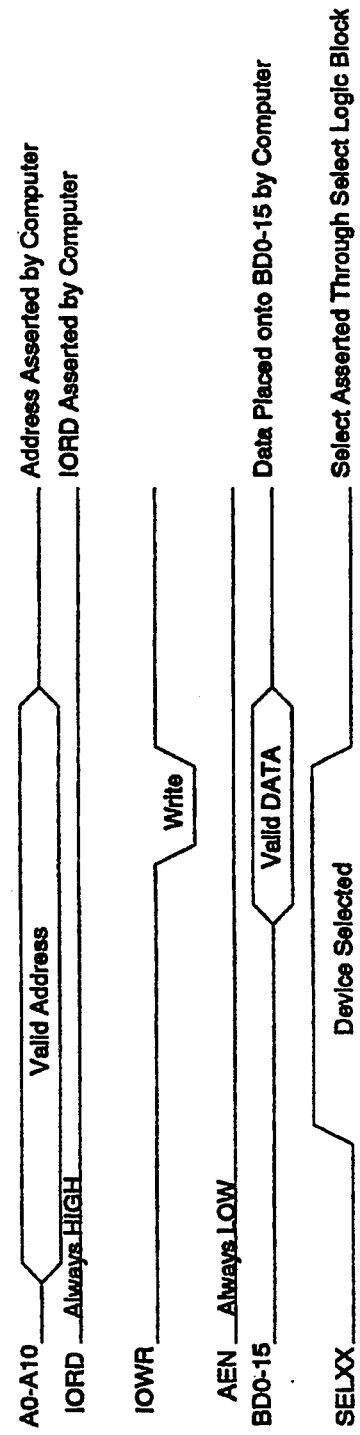

Turning now to a more detailed description of the individual modules which comprise FIG. 3, FIG. 4 shows a block diagram of the computer interface module 101 which is part of the universal driver system 100 of the present invention. Computer interface module 101 is coupled to external computer 50 (see FIG. 2) by computer bus 52. Computer bus 52 is composed of a bi-directional data bus portion which has 16 bi-directional data channels designated D0–D15, an address bus portion which has 11 address channels designated A0–A10 and the 4 control channels designated IORD, IOWR, AEN and IO16CS. Bi-directional data channels D0–D15 function to provide channels for the input and output of data between external computer 50 (see FIG. 2) and universal driver system 100. Address channels A0–A10 function to provide the input channels by which external computer 50 (FIG. 2) directs the flow of data to and from the constituent modules of universal driver system 100. The IORD control channel transmits the input-output read signal generated by external computer 50 to designate that the computer is requesting a "read" from the address location currently valid on the address bus. Similarly, the IOWR control channel transmits the input-output write signal generated by external computer 50 to designate that the computer is requesting a "write" to the address location currently valid on the address bus. The AEN control channel transmits an additional qualification signal used by the computer for certain categories of input-output (IO) signals. A timing diagram showing the time interrelationships of the signals involved in IO read and IO write operations is shown in FIG. 16. The IOC16 control channel functions to provide a logic LOW signal (not shown in FIG. 16) to the computer during read operations signifying that all 16 bits of data are valid.

The aforementioned channels of computer bus 52 couple as inputs to select logic block 131. Select logic block 131 functions to provide the decode capability which allows the external computer to select a particular module of universal driver system 100 and to read or write IO data as required. In the preferred embodiment of FIG. 4, select logic block 131 is implemented using a "programmable array logic" or PAL device such as the MACH 130 programmable logic device manufactured by Advanced Micro Devices, Inc. The high level of circuit integration and the electronic programming capability of such a PAL device offers advantages in cost, speed and ease of manufacture although, as is well known to persons skilled in the art, the functional requirements of select logic block 131 could also be obtained by using other logic circuit arrangements. Select logic block 131 further functions to provide a "driver select" sensing section (not shown). When no driver activity is currently taking place on computer bus 52, the external computer 50 places all drivers into a "listen" mode such that their "driver select" sensing sections wait for the computer to broadcast a driver address. Only the single driver whose address is broadcast will respond to the computer and then turn itself "ON" for selected data transfers with the computer. A further method of driver selection is to select more than one driver at a time for multiple driver information broadcasts from the computer. This feature saves time since multiple drivers often need to be programmed or downloaded with the same information and using a "group" mode allows these actions to be performed in a much shorter time. As shown in FIG. 4, select logic block 131 functions to provide 127 select channels which can be individually activated to perform the selection required to read or write data from or to the individual modules which comprise universal driver system 100. In FIG. 4, these channels are designated SEL0–SEL126 (for simplicity, channels SEL10–SEL121 are not shown) and form part of system bus 102. In actual application, only those select channels required to perform the selection of the particular modules used will be incorporated in system bus 102 as will be shown in the following discussions of the other figures. These select channels are unidirectional (output only) and function in a "1 of 127" fashion meaning that only one select channel will be active at a time during a read or write operation with external computer 50. The basic operation of reading and writing is the same for input or output of data for any of the individual modules which comprise universal driver system 100 as is shown by the timing diagrams of FIG. 16. Select logic block 131 also functions to provide an output data enable control channel DEN and an output data direction channel W_DIR which couple as inputs to transceiver block 132.

Turning again to computer bus 52, the 16 data channels D0–D15 also couple as inputs to transceiver block 132. Transceiver block 132 functions to provide asynchronous two-way communication between the 16 data channels D0–D15 of computer bus 52 and the 16 bidirectional buffered data channels designated BD0–BD15 which are part of system bus 102. Control channels DEN and W_DIR function to determine the direction of data flow either from or to computer bus 52 and to isolate the buffered data channels BD0–BD15 of system bus 102 from the data channels D0–D15 of computer bus 52 as desired. In the preferred embodiment, transceiver block 132 is implemented using SN74HC245 octal bus transceivers manufactured by Texas Instruments Inc. although, as is well known to persons skilled in the art, the functional requirements of transceiver block 132 could also be obtained by using other logic circuit arrangements.

FIG. 5 shows a block diagram of the power management module 103 which is part of the universal driver system 100 of the present invention. In general, power management module 103 functions as a DC to DC converter which generates required voltages and currents and which includes feedback which allows for their control. Power management module 103 is made up of analog-to-digital converter block 133, on-board power module 134, DUT VCC power module 135 and a plurality of generic power modules 136. For simplicity, FIG. 5 shows only one of the generic power modules 136 which is designated the XXth module of a total of YY modules. Power management module 103 functions to provide the regulated DC power required by the constituent modules of the universal driver system 100 and by the DUT's on the particular burn-in board which is associated with that driver system. The power required by the driver system itself is designated "on-board" power and is generated by on-board power module 134. On-board power module 134 comprises a set of linear or switching power supplies which produce the required voltages on the power channels designated on-board VCC, on-board GND, clock VCC, clock GND, analog V+, analog V− and VEE which together comprise on-board power bus 116 which couples to the other modules of driver system 100. On-board power bus 116 also couples to analog-to-digital converter block 133 to provide analog voltage measurement points to be monitored. DUT VCC power module 135 comprises another set of linear or switching power supplies which produce the required voltages and voltage and current sense signals for the associated burn-in board on the channels designated DUT VCC 1, DUT VCC 1 GND, DUT VCC 2, DUT VCC 2, DUT VCC 1 SENSE, DUT VCC 2 SENSE, DUT VCC 1 CURRENT SENSE, and DUT VCC 2 CURRENT SENSE which together form part of power bus 115 which couples to the associated burn-in board 500 (see FIG. 2). These channels of power bus 115 also couple to analog-to-digital converter block 133 to provide analog voltage measurement points to be monitored. Generic power module 136 comprises another set of linear or switching power supplies which produce additionally required voltages and voltage and current sense signals for the associated burn-in board on the channels designated DUT POWER MODULE XX, DUT POWER MODULE XXGND, DUT VCC 1 SENSE, DUT POWER MODULE XX SENSE, and DUT POWER MODULE XX CURRENT SENSE which together form part of power bus 115 which couples to the associated burn-in board 500 (see FIG. 2). These channels of power bus 115 also couple to analog-to-digital converter block 133 to provide analog voltage measurement points to be monitored. Analog-to-digital converter block 133 functions to provide the monitoring function which allows the external computer to control the power supplies within each of the aforementioned power modules. In general, the voltages and currents fed into block 133 are converted from an analog voltage to a digital word and made available for query by the external computer via system bus 102. Any number of voltages and currents can be converted dependant only on the number of feedback paths that are provided on a particular design. An important feature of block 133 is that it is programmable i.e. it has the capability to determine if a particular voltage or current is within the limit window defined by a lower and an upper value. In the preferred embodiment, the limit window is preset to be ±5% and is then varied as device requirements change. Having the capability to generate a single fault signal relieves the computer of having to poll each driver and each voltage channel to determine limit compliance. Both the upper and lower limits of the limit window can be programmed in block 135. Block 133 is also programmable in that it has the capability to select which channel the external computer will examine. In FIG. 5, a simplified notation is used to show the interconnection of system bus 102 with constituent blocks 133, 134, 135 and 136. As previously described, system bus 102 comprises data channels BD0–BD15 and an as required subset of select channels SEL0–SEL126. In FIG. 5, each bus termination labeled "control" comprises a minimum of one select channel and any arrangement of data channels BD0–BD15 as required by the block. The physical implementation of the modules of FIG. 5 will depend upon the power requirements of the particular devices being tested but will be accomplished using DC to DC converter and analog to digital converter technology and well known to those skilled in the art and described in commonly available texts and handbooks such as the Motorola Switching Regulator Handbook published by Motorola Inc.

FIG. 6 shows a block diagram of system timing generation module 104 which is part of the universal driver system 100 of the present invention. System timing generation module 104 provides programmable master and data clock signals required by the individual modules which comprise universal driver system 100. System timing generation module 104 also provides static and dynamic address sequencing signals to the static random access memory (SRAM) which is part of universal driver system 100. System timing generation module 104 comprises an address sequencing block 137 and a plurality of clock sequencing blocks 138 each of which includes a master clock portion 138A and a data clock portion 138B which are coupled together by a master clock linking channel 138C. Master clock portion 138A makes use of a programmable frequency generator such as the AV9101 manufactured by AVASEM Inc. and a crystal to produce a square wave output programmable from 100 Hz up to 110 MHz. Data clock portion 138B makes use of synchronous presettable binary counters such as the MC74AC163 manufactured by Motorola Inc. to perform binary divisions which result in a lower frequency, synchronized data clock required by address sequencing block 137. For simplicity, FIG. 6 shows only one of the clock sequencing blocks 138 which is designated the XXth block of a total of YY blocks. The bi-directional system bus 102 couples to address sequencing block 137 and to the master clock portion. 138A and to the data clock portion 138B on each of the plurality of clock sequencing blocks 138. Address sequencing block 137 produces 19 sequencing output channels designated R0–R18. Each of the clock sequencing blocks 138 produces from its master clock portion 138A a master clock output channel and from its data clock portion a data clock output channel. In FIG. 6, these channels are designated "master clock XX" and "data clock XX" corresponding to the XXth clock sequencing block. The output channels from address sequencing block 137 and from the plurality of clock sequencing blocks 138 together form system timing bus 117 which, as previously described, couples to other modules within universal driver system 100.

FIG. 7 shows a block diagram of the vector hold module 105 which is part of the universal driver system 100 of the present invention. System bus 102 couples to a control input to static RAM bank 139. The data clock XX portion of system timing bus 117 couples to another input to static RAM bank 139 and also to an input of 8-bit counter 140. Static RAM bank 139 has an 8 channel output designated D0–D7 which couples to inputs to 8-bit counter 140. Vector hold module 105 functions to extend the time interval of stored data patterns (vectors) so that certain longer data sequences required to exercise devices under test can be generated without requiring additional memory. Vector hold module 105 consists of static RAM bank 139 and 8-bit counter 140. Static RAM bank 139 is organized as words of memory, with each word containing a certain number of bits. In the preferred embodiment of FIG. 7, static RAM bank 139 is a 128K word×8 bit SRAM such as the MT5C1008 DIP/SMT manufactured by MICRON Inc. although other similar devices could also be used. Functionally, each word of static RAM bank 139 contains a byte number that equals the number of "Data Clock XX" pulses for which a hold signal will be asserted to "hold all current vectors". This function is implemented by loading the particular byte number selected by the external computer into 8-bit counter 140 which operates in a "count up until overflow" mode. The terminal count output of 8-bit counter 140 asserts a hold signal on hold conductor 118 which is part of timing bus 117 and which couples to the hold input of address sequencing block 137 (FIG. 6). When the count of 8-bit counter 140 is 0 (not counting), hold conductor 118 is LOW allowing address sequencing block 137 to function normally. When a non-zero byte number is loaded, 8-bit counter 140 counts up in response to data clock XX until overflow occurs at which the count returns to 0. During this counting interval, hold conductor 118 is HIGH, interrupting the operation of address sequencing block 137. In the preferred embodiment of FIG. 7, 8-bit counter 140 is implemented using two MC74AC163 asynchronous presettable binary counters manufactured by Motorola Inc. although, as is well known to persons skilled in the art, the functional requirements of vector hold module 105 could also be obtained by using other logic circuit arrangements.

FIG. 8 shows a block diagram of the analog generation module 106 which is part of the universal driver system 100 of the present invention. Analog generation module 106 comprises an analog static RAM (SRAM) block 141 and a digital-to-analog converter block 142. Analog SRAM block 141 has as inputs the 19 sequencer address channels designated A0–A18 and the data clock XX channel which are part of system timing bus 117. Analog SRAM block 141 has a control input which couples to system bus 102 and which, as previously described, comprises a minimum of one select channel and any arrangement of data channels BD0–BD15 as required by the block. Analog SRAM 141 functions to store digital values which define the levels of analog signals required by the driver. In the preferred embodiment, Analog SRAM 141 is implemented with a 128K×8 bit SRAM such as the MT5C1008 DIP/SMT manufactured by MICRON Inc. so that each 8 bit word can define one of 256 different levels which can be modified by the external computer via the control input. Analog SRAM 141 has 8 data output channels designated D0–D7 which couple as inputs to digital-to-analog converter 142. Digital-to-analog converter block 142 functions to convert each 8 bit word transmitted from analog SRAM 141 into the analog level which it represents to provide an analog output 119 which couples to the input to analog driver module 113 as previously described. In the preferred embodiment, digital-to-analog converter block 142 is implemented using part type DAC0802LCN manufactured by National Semiconductor Inc. although, as is well known to persons skilled in the art, the functional requirements of analog generation module 106 could also be obtained by using other logic circuit arrangements.

FIG. 9 shows a block diagram of vector storage module 107 which is part of the universal driver system 100 of the present invention. Vector storage module 107 comprises vector SRAM block 145 which has as inputs the 19 sequencer address channels designated A0–A18 and the data clock XX channel which are part of system timing bus 117. Vector SRAM block 145 also has a control input which couples to system bus 102 and which, as previously described, comprises a minimum of one select channel and any arrangement of data channels BD0–BD15 as required by the block. The function of Vector SRAM block 145 is to store the test data patterns (vectors) created by the external computer to define the digital signals which will be applied to the particular DUT's which have been loaded on the burn-in board associated with the driver. The use of vector SRAM block 145 as part of universal driver system 100 is a key factor in its versatility, economy and ease of use since vector SRAM block block 145 (and the other modules of the driver system) can be changed to accommodate a wide variety of different type DUT's via software control by the external computer without a requirement for changing the hardware. For the particular embodiment of FIG. 9, vector SRAM block 145 is implemented using a 128K×8 bit SRAM such as the MT5C1008 DIP/SMT manufactured by MICRON Inc. which therefore define digital sequences for 8 vector channels each with a length of 128K clock cycles. Implementation of additional vector channels is accomplished by simply paralleling additional SRAMs so that the requirements for different type DUT's is easily met. Vector SRAM block 145 also includes an 8-bit bi-directional transceiver such as the 74HC245 manufactured by Texas Instruments, Inc. which is used to connect the SRAM to the data channels of system bus 102 and which has the effect of dual porting the SRAM so that data can flow both to and from the external computer. Vector SRAM block 145 has 8 data output channels designated D0–D7 which form vectors bus 122 which couples to other modules of universal driver system 100 as previously described. Vector SRAM block 145 also includes an octal edge triggered D-type flip such as the 74HC574 manufactured by Texas Instruments, Inc. which is used to buffer the data output channels D0–D7 of vectors bus 122.

FIG. 10 shows a block diagram of tri-state control module 108 which is part of the universal driver system 100 of the present invention. Tri-state control module 107 comprises a plurality of tri-state SRAM blocks 150. For simplicity, FIG. 10 shows only one of the tri-state SRAM blocks 150 which is designated the XXth SRAM of a total of YY SRAM's. Tri-state SRAM block 150 has as inputs the 19 sequencer address channels designated A0–A18 and the data clock XX channel which are part of system timing bus 117. Tri-state SRAM block 150 also has a control input which couples to system bus 102 and which, as previously described, comprises a minimum of one select channel and any arrangement of data channels BD0–BD15 as required by the block. The function of tri-state SRAM block 150 is to provide an additional dimension of output driver control by allowing a particular output driver to be switched to a high-impedance or disconnected state in addition to the drivers normal ON (current sourcing) and normal OFF (current sinking) states. This additional capability allows greater application flexibility for the driver by allowing it to be configured in many different ways. Tri-state SRAM's 150 has 8 data output channels designated D0–D7 which are divided to form tri-state vectors bus 123 and tri-state monitor bus 124 both of which couple to other modules of universal driver system 100 as previously described. For the particular case of the XXth tri-state SRAM shown in FIG. 10, the 8 data output channels are divided equally with 4 channels D0–D3 coupling to tri-state vectors bus 123 and 4 channels D4–D7 coupling to tri-state monitors bus 124. In actual application, the number of data channels can be split differently to suit the requirements of the associated modules. For the particular embodiment of FIG. 10, each of the SRAM's of tri-state SRAM block 150 is implemented using a 128K×8 bit SRAM such as the MT5C1008 DIP/SMT manufactured by MICRON Inc. which therefore define digital sequences for 8 channels each with a length of 128K clock cycles. Implementation of additional tri-state channels is accomplished by simply paralleling additional SRAMs so that the requirements for different type DUT's is easily met. For each of the SRAM's of tri-state SRAM block 150 there is also included an 8-bit bi-directional transceiver such as the 74HC245 manufactured by Texas Instruments, Inc. which is used to connect the SRAM to the data channels of system bus 102 and which has the effect of dual porting the SRAM so that data can flow both to and from the external computer.

FIG. 11 shows a block diagram of automatic programming module 109 which is part of the universal driver system 100 of the present invention. Automatic programming module 109 comprises serial to parallel interface circuit 153 which couples to system bus 102, system timing bus 117 and automatic programming channel 130 from the associated burn-in board 500 (not shown). Each individual burn-in board contains a permanently mounted EEPROM (electrically erasable programmable read only memory) which contains a serial code which uniquely identifies that particular board. The function of serial to parallel interface circuit 153 is to translate the serial code transmitted on automatic programming channel 130 into a parallel format which is made available on the parallel data channels of system bus 102 to be read and interpreted by the external computer. The designation "automatic" refers to the fact that various different types of burn-in boards 500 can be loaded into a burn-in chamber and the universal driver systems 100 associated with each of them will "automatically" recognize the identification code which uniquely identifies the particular burn-in board 500 and will then pass this code to external computer 50 over system bus 152 and computer bus 52 so that universal driver system 100 can be appropriately reconfigured by program without the need for human intervention to make changes on the driver system itself. The permanently mounted EEPROM located on each burn-in board can be of several types depending on the particular choices of the system user. Accordingly, the particular embodiment of FIG. 11 will vary depending on the timing and signal requirements which must be met to read the serial data using logic circuitry well known to those skilled in the art. FIG. 12 shows a block diagram of DUT monitoring module 110 which is part of the universal driver system 100 of the present invention. DUT monitoring module 110 comprises skew compare block 155, SRAM 156 and comparator block 157. Sequencer outputs A0–A18 which are part of timing bus 117 couple to inputs to SRAM 156, skew compare block 155 and comparator 157. The data clock XX signal path which is part of timing bus 117 also couples to an input of skew compare block 155 and SRAM 156. Skew compare block 155 produces a "compare now" output on signal path 155A which couples to an input of comparator block 157. SRAM 156 has data outputs D0–D7 which couple to the compare "TO" data inputs to comparator block 157. DUT monitors bus 127 which couples to the burn-in board 500 associated with the driver system 100 of interest also couples to the compare "FROM" data input of comparator block 157. SRAM 156 and comparator block 157 each have a control input which couples to system bus 102 and which, as previously described, comprises a minimum of one select channel and any arrangement of bi-directional data channels BD0–BD15 as required by the block. The function of DUT monitoring module 110 is to provide information about the operating condition of DUT's on the associated burn-in board 500 (not shown) to the external computer which is controlling and altering the operation of a particular universal driver system 100. This information is obtained by comparing data received from the DUT's via DUT monitoring bus 127 with expected data which has been stored in SRAM 156 by the external computer. The comparison is performed by comparator block 157 under control of timing signals from timing bus 117 and the "compare now" signal produced by skew compare block 155 and coupled as an input to comparator 157. The function of skew compare block 155 is to provide a time delay which will compensate for time differences between the expected (compare "TO") data appearing on the D0–D7 outputs of SRAM 156 and the compare "FROM" data which is returned from the associated burn-in board via DUT monitors bus 127, said time difference being caused by the additional signal path lengths to and from the burn-in board. When the comparison performed by comparator block 157 shows a difference, the information is passed via the bi-directional data channels of system bus 102 to external computer 50 for interpretation and action which might include datalogging and/or altering burn-in conditions. The hardware implementation of the particular embodiment of FIG. 12 can take on a variety of different forms depending upon the requirements of the application. For example, a simplified DUT monitoring scheme can be employed where any error or discrepancy indicated by comparator block 157 will set a single bit "DUT error" indicator monitored by the external computer. In a more complex scheme, additional items of information such as the DUT address, the vector address of the DUT that fails and the time of failure can be established by the interaction with the external computer. An important feature of the driver system of the present invention is the use of memory means controllable by external computer 50 to store a "pass-fail" map defining which of the DUT's housed on the burn-in board have passed or failed particular portions of the burn-in sequence. This map offers several advantages in that the documentation of pass-fail catagories resides and is stored in the burn-in board after it is removed from the system. This allows the pass-fail status to be read again on a separate computer system or over a computer network and the resultant data to control other processes such as the unloading and "binning" (separating into failure catagories) by computer-controlled automatic equipment or diagnostic data logging for reliability analysis. In the preferred embodiment, the memory means used to implement this feature is the same EEPROM previously discussed relating to burn-in board identification for automatic prographing although, as is well known to persons skilled in the art, a variety of other types of memory means could be used to implement this concept.

FIG. 13 shows a block diagram of on-board status module 111 which is part of the universal driver system 100 of the present invention. On-board status module 111 functions by using compare module 162 to provide a comparison of the digital patterns present on vectors bus 122 with the digital patterns on driven vector bus 125 and to transmit the results of this comparison on status channel 163. Status logic block 161 combines the comparison signal on status channel 163 with gated timing signals derived from timing bus 117 to transmit an on-board status signal to external computer 50 (not shown) via system bus 102 at the appropriate time interval. On-board status module 111 comprises a status logic block 161 and a compare block 162. System bus 102 is coupled to a first input and system timing bus 117 is coupled to a second input of status logic block 161. Vectors bus 122 couples to a first input, tri-state bus 122 couples to a second input and driven vector bus 125 couples to a third input of compare block 162. Status signal path 163 couples from the status output of compare block 162 to the status input of status logic block 161. In the preferred embodiment, status logic block 161 and compare block 162 are implemented using MC74ACT86 Exclusive-OR gates, MC74AC74 D-type flip-flops and MC74HCT244 3-state Buffer/Line Driver integrated circuits all manufactured by Motorola Inc. although, as is well known to persons skilled in the art, the functional requirements of on-board status module 111 could also be obtained by using other logic circuit arrangements.

FIG. 14 shows a block diagram of output driver module 112 which is part of the universal driver system 100 of the present invention. Output driver module 112 comprises a plurality of line driver circuits 164. For simplicity, FIG. 14 shows one representative line driver circuit 164 which is the XXth circuit of a total of YY circuits. The total number of circuits (YY) is determined by the number of driven vector channels required by the burn-in board 500 that is associated with the driver system 100 of interest. Each line driver circuit 164 comprises an integrated circuit which contains a plurality of individual drivers which are externally coupled in parallel. A key feature of the present invention is the use of this parallel external coupling to improve the high speed drive capability of output driver module 112. For the representative driver circuit 164 shown in FIG. 14, the XXth data line of vectors bus 122 couples in parallel to the 8 inputs R1–R8 of the 8 individual drivers which are contained in line driver circuit 164. The 8 outputs Y1–Y8 of these 8 individual drivers are similarly coupled in parallel to form a XXth driven vector channel designated DUTXX which is part of driven vector bus 125. TSXX which is the XXth channel of tri-state bus 123 is coupled to the G1 and G2 inputs of representative driver circuit 164 to provide tri-state capability to the XXth driven vector channel. A suitable line driver integrated circuit for the particular embodiment shown in FIG. 14 is part type 74FCT541 manufactured by Texas Instruments, Inc. although other types of integrated circuits with similar characteristics could also be used.

FIG. 15 shows a block diagram of analog driver module 113 which is part of the universal driver circuit 100 of the present invention. Analog driver module 113 comprises a high-gain operational amplifier 165 which functions to provide increased current drive capability to the analog output channel. For simplicity, FIG. 15 shows a single operational amplifier 165 although more than one amplifier can be used if required by the application. For the particular embodiment of FIG. 15, high-gain operational amplifier 165 is implemented using a darlington push-pull configuration incorporating 2N3904 NPN and 2N3906 PNP transistors manufactured by Motorola Inc. although, as is well known to persons skilled in the art, other types of transistors or integrated circuits having suitable characteristics could also be used. Analog bus 119 is coupled to the signal input of high-gain operational amplifier 165. The analog V+ power conductor 116A and the analog V− power conductor 116B which are part of on-board power bus 116 are coupled to the power inputs of high-gain operational amplifier 165. The signal output of high-gain operational amplifier 165 couples to driven analog bus 120 (an output bus) which couples to the analog channels 121 which couple to the analog channel inputs of the burn-in board 500 (not shown) associated with this particular universal driver system 100.

Figure 17:
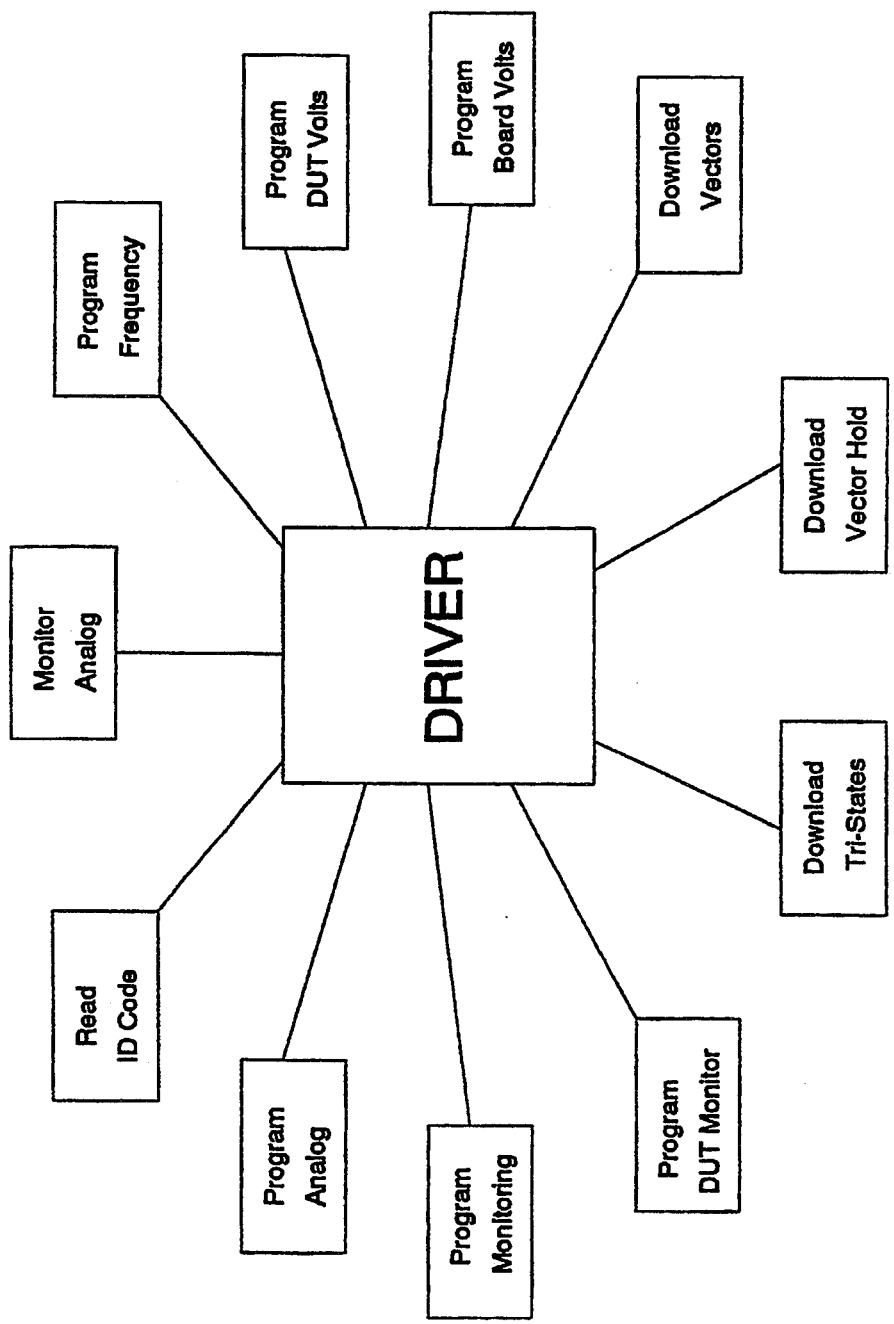
FIG. 17 is a functional relationship diagram summarizing the operating functions of the universal driver system of the present invention.

FIG. 17 is a functional relationship diagram summarizing the operating functions of the universal driver system of the present invention. Each of these functions has been described individually in terms of the operation of the constituent modules of the driver system already described. In terms of the overall operation, a burn-in sequence begins with the READ ID CODE block indicating the process by which the external computer identifies the particular burn-in board connected to a particular driver and correspondingly determines from its program the particular "project" that will be required for the devices known to be installed on the identified burn-in board. The execution of the computer program then causes the reconfiguration of the individual modules of the driver system as required. This reconfiguration includes the read-write sequences for PROGRAM ANALOG, PROGRAM MONITORING, PROGRAM DUT MONITOR, PROGRAM BOARD VOLTS, PROGRAM DUT VOLTS and PROGRAM FREQUENCY as dictated by the functional requirements of the individual driver modules previously described. These sequences can occur in any order and will be determined by the needs of an efficient programing sequence. Similarly, the execution of the computer program also causes storage of required vector and auxiliary control patterns in the SRAM modules of the driver system in accordance with the needs of the devices known to be installed on the identified burn-in board. This is accomplished via the read-write sequences for DOWNLOAD TRI-STATES, DOWNLOAD VECTOR HOLD and DOWNLOAD VECTORS as dictated by the functional requirements of the individual driver modules previously described. These sequences can also occur in any order and will be determined by the needs of an efficient programming sequence. After the "project" has been completely loaded, the computer program initiates the actual burn-in sequence and determined by the schedule of events determined for the "project". This schedule can be as simple or as complex as desired for the particular devices being tested and can include sequences with differing temperatures, voltages, clock frequencies, analog frequencies, etc in whatever order and for whatever duration is desired. Additionally, sequences can be altered based on detected changes in the operating condition of devices under test through use of the MONITOR ANALOG function thereby creating a driver system which is highly versatile. This versatility is a key advantage of the present invention in that all of these changes in test condition can be accomplished quickly without removing the driver system from the burn-in environment and without making any mechanical changes. This feature bootstraps a still further advantage in that the existence of a single mechanical design allows this design to be optimized for high frequency operation so that devices under test can be operated at much higher internal clock rates so that overall burn-in cycles can be shortened.

I claim:

1. A burn-in system comprising, in combination:

control means electrically connected to a plurality of different electronic devices undergoing burn-in comprising at least one group of electronic devices of the same type undergoing burn-in and at least another group of electronic devices of a different type undergoing burn-in for providing at least one of an electrical current and voltage of the same characteristics for burning in to said one group of electronic devices of the same type undergoing burn-in and for simultaneously providing at least one of an electrical current and voltage of different characteristics for burning in to said another group of electronic devices of a different type undergoing burn-in;

burn-in driver means for both applying for an extended period of time the same electrical currents and voltages to said one group of electronic devices of the same type undergoing burn-in and for applying different electrical currents and voltages to said another group of electronic devices of a different type undergoing burn-in to test and burn-in all of the groups of electronic devices; and identification means coupled to said control means for identifying the devices of said one group of electronic devices of the same type undergoing burn-in and identifying the devices of said another group of electronic devices of a different type undergoing burn-in;

said control means responding to said identification means for controlling a sequence of tests to said one group of electronic devices and a different sequence of tests to said another group of electronic devices and for changing said sequence of tests as required by either said one group of electronic devices or said another group of electronic devices.

2. A burn-in system according to claim 1 further comprising:

heating means for applying temperature stress for said test and burn-in of said groups of electronic devices.

3. A burn-in system according to claim 2, said electronic devices further comprising semiconductor devices.

4. A burn-in system according to claim 3, said semiconductor devices further comprising at least one of analog and linear devices.

5. A burn-in system according to claim 3, said semiconductor devices further comprising at least one of digital logic, memory and microprocessor devices.

6. A burn-in system according to claim 3, said burn-in driver means further comprising storage means for storing information defining the magnitude and duration of said electrical currents and voltages.

7. A burn-in system according to claim 6, said storage means comprising test vector storage means.

8. A burn-in system according to claim 7, said information comprising data patterns defining the sequence of electrical signals to be applied to devices under test.

9. A burn-in system according to claim 8 further comprising computer means for controlling said burn-in driver means.

10. A burn-in system according to claim 9, said burn-in driver means further comprising computer interface module means coupled to said computer means via a bi-directional computer bus and coupled to a system bus for providing transceiver and select logic functions for data being transferred to and from said computer means via said system bus.

11. A burn-in system according to claim 10, said burn-in driver means further comprising power management module means coupled to said system bus and coupled to a power bus, a DUT Vcc bus and an on-board power bus for measuring and regulating voltages required by said system.

12. A burn-in system according to claim 11, said burn-in driver means further comprising system timing generation module means coupled to said system bus and coupled to a system timing bus and to a hold bus for providing programmable master and data clock signals required by said system.

13. A burn-in system according to claim 12, said burn-in driver means further comprising vector hold module means coupled to said system bus, to said system timing bus and to said hold bus for altering said programmable master and data clock signals required by said system to extend the time interval of stored data patterns.

14. A burn-in system according to claim 13, said burn-in driver means further comprising analog generation module means coupled to said system timing bus and to said system bus and to an analog bus for generating analog signals based on stored patterns.

15. A burn-in system according to claim 14, said burn-in driver means further comprising analog driver module means coupled to said analog bus and to a driven analog bus for providing higher current drive capability to channels of said driven analog bus.

16. A burn-in system according to claim 15, said burn-in driver means further comprising vector storage module means coupled to said system timing bus and to said system bus and to a vectors bus for retaining test vectors to be applied to devices under test.

17. A burn-in system according to claim 16, said burn-in driver means further comprising tri-state control module means coupled to said system bus, to said system timing bus, to said DUT Vcc bus and to a tri-state bus and to a tri-state vectors bus for causing an output driver to be switched to a high impedance or disconnected state.

18. A burn-in system according to claim 17, said burn-in driver means further comprising output driver module means coupled to said vectors bus, to said tri-state vectors bus and to a driven vectors bus for providing current amplification of test vectors transmitted on said vectors bus.

19. A burn-in system according to claim 18, said burn-in driver means further comprising on-board status monitoring module means coupled to said vectors bus, to said tri-state bus, to said system bus and to said driven vectors bus for monitoring for faults in the various modules of said system.

20. A burn-in system according to claim 19, said burn-in driver means further comprising DUT monitoring module means coupled to said system bus, to said system timing bus and to a DUT monitors bus for monitoring for operating failures in the devices being tested by said system.

21. A burn-in system according to claim 20, said burn-in driver means further comprising burn-in board means coupled to said driven analog bus, to said driven vectors bus, to said power bus, to said DUT monitors bus and to said automatic programming bus for housing devices to be tested.

22. A burn-in system according to claim 21, said burn-in driver means further comprising automatic programming module means coupled to said system bus, to said system timing bus and to an automatic programming bus for translating a unique code identifying said burn-in board means.

23. A burn-in system according to claim 1, said means electrically connected to a plurality of different electronic devices further comprising memory means for storing information describing test results for said first and said second groups of electronic devices.

24. A burn-in system according to claim 23, said memory means further comprising an electronically erasable programmable memory (EEPROM).

25. A burn-in system according to claim 23, said memory means further comprising a pass-fail map for DUT's housed in a burn-in board.

26. A burn-in driver system comprising:
test vector storage means for storing data patterns defining the sequence of electrical signals for a burn-in operation to be applied to devices under test;
burn-in driver means for controlling the magnitude and frequency content of said electrical signal for burn-in of said devices under test, said burn-in driver means further comprising means for identifying said devices under test; and
computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test.

27. A burn-in system according to claim 26 further comprising monitor means coupled to said devices under test for determining a change in the response of said devices under test to said electrical signals applied to said devices under test.

28. A burn-in system according to claim 27, said burn-in driver means further comprising computer interface module means coupled to said computer means via a bi-directional computer bus and coupled to a system bus for providing transceiver and select logic functions for data being transferred to and from said computer means via said system bus.

29. A burn-in system according to claim 28, said burn-in driver means further comprising power management module means coupled to said system bus and coupled to a power bus, a DUT Vcc bus and an on-board power bus for measuring and regulating voltages required by said system.

30. A burn-in system according to claim 29, said burn-in driver means further comprising system timing generation module means coupled to said system bus and coupled to a system timing bus and to a hold bus for providing programmable master and data clock signals required by said system.

31. A burn-in system according to claim 30, said burn-in driver means further comprising vector hold module means coupled to said system bus, to said system timing bus and to said hold bus for altering said programmable master and data clock signals required by said system to extend the time interval of stored data patterns.

32. A burn-in system according to claim 31, said burn-in driver means further comprising analog generation module means coupled to said system timing bus and to said system bus and to an analog bus for generating analog signals based on stored patterns.

33. A burn-in system according to claim 32, said burn-in driver means further comprising analog driver module means coupled to said analog bus and to a driven analog bus for providing higher current drive capability to channels of said driven analog bus.

34. A burn-in system according to claim 33, said burn-in driver means further comprising vector storage module means coupled to said system timing bus and to said system bus and to a vectors bus for retaining test vectors to be applied to devices under test.

35. A burn-in system according to claim 34, said burn-in driver means further comprising tri-state control module means coupled to said system bus, to said system timing bus, to said DUT Vcc bus and to a tri-state bus and to a tri-state vectors bus for causing an output driver to be switched to a high impedance or disconnected state.

36. A burn-in system according to claim 35, said burn-in driver means further comprising output driver module means coupled to said vectors bus, to said tri-state vectors bus and to a driven vectors bus for providing current amplification of test vectors transmitted on said vectors bus.

37. A burn-in system according to claim 36, said burn-in driver means further comprising on-board status monitoring module means coupled to said vectors bus, to said tri-state bus, to said system bus and to said driven vectors bus for monitoring for faults in the various modules of said system.

38. A burn-in system according to claim 37, said burn-in driver means further comprising DUT monitoring module means coupled to said system bus, to said system timing bus and to a DUT monitors bus for monitoring for operating failures in the devices being tested by said system.

39. A burn-in system according to claim 38, said burn-in driver means further comprising burn-in board means coupled to said driven analog bus, to said driven vectors bus, to said power bus, to said DUT monitors bus and to said automatic programming bus for housing devices to be tested.

40. A burn-in system according to claim 39, said burn-in driver means further comprising automatic programming module means coupled to said system bus, to said system timing bus and to an automatic programming bus for translating a unique code identifying said burn-in board means.

41. A burn-in system comprising:
   computer means coupled to a computer bus for controlling a sequence of tests;
   test vector storage means coupled to said computer bus and to a vectors bus for storing a digital pattern describing said sequence of tests;
   burn-in board means coupled to said vectors bus for housing electronic devices of a particular type to be tested by said system, said burn-in board means having an identification code; and
   automatic programming means coupled to said burn-in board means and coupled to said computer bus for transmitting said identification code to said computer means;
   said computer means interpreting said identification code and changing said sequence of tests as required by said particular type of electronic devices to be tested by said system.

42. The burn-in system according to claim 41, said burn-in driver means further comprising computer interface module means coupled to said computer means via a bi-directional computer bus and coupled to a system bus for providing transceiver and select logic functions for data being transferred to and from said computer means via said system bus.

43. A burn-in system according to claim 42, said burn-in driver means further comprising power management module means coupled to said system bus and coupled to a power bus, a DUT Vcc bus and an on-board power bus for measuring and regulating voltages required by said system.

44. A burn-in system according to claim 43, said burn-in driver means further comprising system timing generation module means coupled to said system bus and coupled to a system timing bus and to a hold bus for providing programmable master and data clock signals required by said system.

45. A burn-in system according to claim 44, said burn-in driver means further comprising vector hold module means coupled to said system bus, to said system timing bus and to said hold bus for altering said programmable master and data clock signals required by said system to extend the time interval of stored data patterns.

46. A burn-in system according to claim 45, said burn-in driver means further comprising analog generation module means coupled to said system timing bus and to said system bus and to an analog bus for generating analog signals based on stored patterns.

47. A burn-in system according to claim 46, said burn-in driver means further comprising analog driver module means coupled to said analog bus and to a driven analog bus for providing higher current drive capability to channels of said driven analog bus.

48. A burn-in system according to claim 47, said burn-in driver means further comprising vector storage module means coupled to said system timing bus and to said system bus and to a vectors bus for retaining test vectors to be applied to devices under test.

49. A burn-in system according to claim 48, said burn-in driver means further comprising tri-state control module means coupled to said system bus, to said system timing bus, to said DUT Vcc bus and to a tri-state bus and to a tri-state vectors bus for causing an output driver to be switched to a high impedance or disconnected state.

50. A burn-in system according to claim 49, said burn-in driver means further comprising output driver module means coupled to said vectors bus, to said tri-state vectors bus and to a driven vectors bus for providing current amplification of test vectors transmitted on said vectors bus.

51. A burn-in system according to claim 50, said burn-in driver means further comprising on-board status monitoring module means coupled to said vectors bus, to said tri-state bus, to said system bus and to said driven vectors bus for monitoring for faults in the various modules of said system.

52. A burn-in system according to claim 51, said burn-in driver means further comprising DUT monitoring module means coupled to said system bus, to said system timing bus and to a DUT monitors bus for monitoring for operating failures in the devices being tested by said system.

53. A burn-in system according to claim 52, said burn-in driver means further comprising automatic programing module means coupled to said system bus, to said system timing bus and to an automatic programing bus for translating the identification code of a burn-in board.

54. A burn-in system according to claim 53, said burn-in driver means further comprising burn-in board means coupled to said driven analog bus, to said driven vectors bus, to said power bus, to said DUT monitors bus and to said automatic programming bus for housing devices to be tested.

55. A burn-in driver system comprising:
computer means for controlling said system;
computer interface module means coupled to said computer means via a bi-directional computer bus and coupled to a system bus for providing transceiver and select logic functions for data being transferred to and from said computer means via said system bus;
power management module means coupled to said system bus and coupled to a power bus, a DUT vcc bus and an on-board power bus for measuring and regulating voltages required by said system;
system timing generation module means coupled to said system bus and coupled to a system timing bus and to a hold bus for providing programmable master and data clock signals required by said system;
vector hold module means coupled to said system bus, to said system timing bus and to said hold bus for altering said programmable master and data clock signals required by said system to extend the time interval of stored data patterns;
analog generation module means coupled to said system timing bus and to said system bus and to an analog bus for generating analog signals based on stored patterns;
analog driver module means coupled to said analog bus and to a driven analog bus for providing higher current drive capability to channels of said driven analog bus;
vector storage module means coupled to said system timing bus and to said system bus and to a vectors bus for retaining test vectors to be applied to devices under test;
tri-state control module means coupled to said system bus, to said system timing bus, to said DUT Vcc bus and to a tri-state bus and to a tri-state vectors bus for causing an output driver to be switched to a high impedance or disconnected state;
output driver module means coupled to said vectors bus, to said tri-state vectors bus and to a driven vectors bus for providing current amplification of test vectors transmitted on said vectors bus;
on-board status monitoring module means coupled to said vectors bus, to said tri-state bus, to said system bus and to said driven vectors bus for monitoring for faults in the various modules of said system;
DUT monitoring module means coupled to said system bus, to said system timing bus and to a DUT monitors bus for monitoring for operating failures in the devices being tested by said system;
burn-in board means coupled to said driven analog bus, to said driven vectors bus, to said power bus, to said DUT monitors bus and to said automatic programming bus for housing devices to be tested and
automatic programming module means coupled to said system bus, to said system timing bus and to an automatic programming bus for translating a unique code identifying said burn-in board means;
said computer means dynamically modifying the sequence of test signals to said devices to be tested during burn-in in response to the translation of said unique code identifying said burn-in board means.

56. A method for making burn-in system comprising the steps of:
providing control means electrically connected to a plurality of different electronic devices undergoing burn-in comprising at least one group of electronic devices of the same type undergoing burn-in and at least another group of electronic devices of a different type undergoing burn-in for providing at least one of an electrical current and voltage of the same characteristics for burning in to said one group of electronic devices of the same type undergoing burn-in and for simultaneously providing at least one of an electrical current and voltage of different characteristics for burning in to said another group of electronic devices of a different type undergoing burn-in;
providing burn-in driver means for both applying for an extended period of time the same electrical currents and voltages to said one group of electronic devices of the same type undergoing burn-in and for applying different electrical currents and voltages to said another group of electronic devices of a different type undergoing burn-in to test and burn-in all of the groups of electronic devices; and
providing identification means coupled to said control means for identifying the devices of said one group of electronic devices of the same type undergoing burn-in and identifying the devices of said another group of electronic devices of a different type undergoing burn-in;
said control means responding to said identification means for controlling a sequence of tests to said one group of electronic devices and a different sequence of tests to said another group of electronic devices and for changing said sequence of tests as required by either said one group of electronic devices or said another group of electronic devices.

57. The method for making a burn-in system according to claim 56 further comprising the step of:

providing heating means for applying temperature stress for said test and burn-in of said groups of electronic devices.

58. The method for making a burn-in system according to claim 57, said electronic devices further comprising semiconductor devices.

59. The method for making a burn-in system according to claim 58, said semiconductor devices further comprising analog or linear devices.

60. The method for making a burn-in system according to claim 58, said semiconductor devices further comprising digital logic or memory devices.

61. The method for making a burn-in system according to claim 58, said step of providing burn-in driver means further comprising the step of providing storage means for storing information defining the magnitude and duration of said electrical currents and voltages.

62. The method for making a burn-in system according to claim 61, said storage means further comprising test vector storage means.

63. The method for making a burn-in system according to claim 62, said information comprising data patterns defining the sequence of electrical signals to be applied to devices under test.

64. The method for making a burn-in system according to claim 63 further comprising the step of providing computer means for controlling said burn-in driver means.

65. The method for making a burn-in system according to claim 64 further comprising the step of providing computer interface module means coupled to said computer means via a bi-directional computer bus and coupled to a system bus for providing transceiver and select logic functions for data being transferred to and from said computer means via said system bus.

66. The method for making a burn-in system according to claim 65 further comprising the step of providing power management module means coupled to said system bus and coupled to a power bus, a DUT Vcc bus and an on-board power bus for measuring and regulating voltages required by said system.

67. The method for making a burn-in system according to claim 66 further comprising the step of providing system timing generation module means coupled to said system bus and coupled to a system timing bus and to a hold bus for providing programmable master and data clock signals required by said system.

68. The method for making a burn-in system according to claim 67 further comprising the step of providing vector hold module means coupled to said system bus, to said system timing bus and to said hold bus for altering said programmable master and data clock signals required by said system to extend the time interval of stored data patterns.

69. The method for making a burn-in system according to claim 68 further comprising the step of providing analog generation module means coupled to said system timing bus and to said system bus and to an analog bus for generating analog signals based on stored patterns.

70. The method for making a burn-in system according to claim 69 further comprising the step of providing analog driver module means coupled to said analog bus and to a driven analog bus for providing higher current drive capability to channels of said driven analog bus.

71. The method for making a burn-in system according to claim 70 further comprising the step of providing vector storage module means coupled to said system timing bus and to said system bus and to a vectors bus for retaining test vectors to be applied to devices under test.

72. The method for making a burn-in system according to claim 71 further comprising the step of providing tri-state control module means coupled to said system bus, to said system timing bus, to said DUT Vcc bus and to a tri-state bus and to a tri-state vectors bus for causing an output driver to be switched to a high impedance or disconnected state.

73. The method for making a burn-in system according to claim 72 further comprising the step of providing output driver module means coupled to said vectors bus, to said tri-state vectors bus and to a driven vectors bus for providing current amplification of test vectors transmitted on said vectors bus.

74. The method for making a burn-in system according to claim 73 further comprising the step of providing on-board status monitoring module means coupled to said vectors bus, to said tri-state bus, to said system bus and to said driven vectors bus for monitoring for faults in the various modules of said system.

75. The method for making a burn-in system according to claim 74 further comprising the step of providing DUT monitoring module means coupled to said system bus, to said system timing bus and to a DUT monitors bus for monitoring for operating failures in the devices being tested by said system.

76. The method for making a burn-in system according to claim 75, further comprising the step of providing burn-in board means coupled to said driven analog bus, to said driven vectors bus, to said power bus, to said DUT monitors bus and to said automatic programming bus for housing devices to be tested.

77. The method for making a burn-in system according to claim 76 further comprising the step of providing automatic programing module means coupled to said system bus, to said system timing bus and to an automatic programming bus for translating a unique code identifying said burn-in board means.

78. A method for making a burn-in system comprising the steps of:
providing test vector storage means for storing data patterns defining the sequence of electrical signals for a burn-in operation to be applied to devices under test;
providing burn-in driver means for controlling the magnitude and frequency content of said electrical signal for burn-in of said devices under test, said burn-in driver means further comprising means for identifying said devices under test; and
providing computer means coupled to said test vector storage means and coupled to said burn-in driver means for changing said sequence, said magnitude and said frequency under program control in response to said means for identifying said devices under test to dynamically modify said sequence of electrical signals for burn-in of said devices under test.

79. The method for making a burn-in system according to claim 78 further comprising the step of providing monitor means coupled to said devices under test for determining a change in the response of said devices under test to said electrical signals applied to said devices under test.

80. The method for making a burn-in system according to claim 79 further comprising the step of providing computer interface module means coupled to said computer means via a bi-directional computer bus and coupled to a system bus for providing transceiver and select logic functions for data being transferred to and from said computer means via said system bus.

81. The method for making a burn-in system according to claim 80 further comprising the step of providing power management module means coupled to said system bus and coupled to a power bus, a DUT Vcc bus and an on-board power bus for measuring and regulating voltages required by said system.

82. The method for making a burn-in system according to claim 81 further comprising the step of providing system timing generation module means coupled to said system bus and coupled to a system timing bus and to a hold bus for providing programmable master and data clock signals required by said system.

83. The method for making a burn-in system according to claim 82 further comprising the step of providing vector hold module means coupled to said system bus, to said system timing bus and to said hold bus for altering said programmable master and data clock signals required by said system to extend the time interval of stored data patterns.

84. The method for making a burn-in system according to claim 83 further comprising the step of providing analog generation module means coupled to said system timing bus and to said system bus and to an analog bus for generating analog signals based on stored patterns.

85. The method for making a burn-in system according to claim 84 further comprising the step of providing analog driver module means coupled to said analog bus and to a driven analog bus for providing higher current drive capability to channels of said driven analog bus.

86. The method for making a burn-in system according to claim 85 further comprising the step of providing vector storage module means coupled to said system timing bus and to said system bus and to a vectors bus for retaining test vectors to be applied to devices under test.

87. The method for making a burn-in system according to claim 86 further comprising the step of providing tri-state control module means coupled to said system bus, to said system timing bus, to said DUT Vcc bus and to a tri-state bus and to a tri-state vectors bus for causing an output driver to be switched to a high impedance or disconnected state.

88. The method for making a burn-in system according to claim 87 further comprising the step of providing output driver module means coupled to said vectors bus, to said tri-state vectors bus and to a driven vectors bus for providing current amplification of test vectors transmitted on said vectors bus.

89. The method for making a burn-in system according to claim 88 further comprising the step of providing on-board status monitoring module means coupled to said vectors bus, to said tri-state bus, to said system bus and to said driven vectors bus for monitoring for faults in the various modules of said system.

90. The method for making a burn-in system according to claim 89 further comprising the step of providing DUT monitoring module means coupled to said system bus, to said system timing bus and to a DUT monitors bus for monitoring for operating failures in the devices being tested by said system.

91. The method for making a burn-in system according to claim 90 further comprising the step of providing burn-in board means coupled to said driven analog bus, to said driven vectors bus, to said power bus, to said DUT monitors bus and to said automatic programming bus for housing devices to be tested.

92. The method for making a burn-in system according to claim 91 further comprising the step of providing automatic programming module means coupled to said system bus, to said system timing bus and to an automatic programming bus for translating a unique code identifying said burn-in board means.

93. A method for making a burn-in system comprising the steps of:
providing computer means coupled to a computer bus for controlling a sequence of tests;
providing test vector storage means coupled to said computer bus and to a vectors bus for storing a digital pattern describing said sequence of tests;
providing burn-in board means coupled to said vectors bus for housing electronic devices of a particular type to be tested by said system, said burn-in board means having an identification code; and
providing automatic programming means coupled to said burn-in board means and coupled to said computer bus for transmitting said identification code to said computer means;
said computer means interpreting said identification code and changing said sequence of tests as required by said particular type of electronic devices to be tested by said system.

94. The method for making a burn-in system according to claim 93, said step of providing burn-in driver means further comprising the step of providing computer interface module means coupled to said computer means via a bi-directional computer bus and coupled to a system bus for providing transceiver and select logic functions for data being transferred to and from said computer means via said system bus.

95. The method for making a burn-in system according to claim 94 further comprising the step of providing power management module means coupled to said system bus and coupled to a power bus, a DUT Vcc bus and an on-board power bus for measuring and regulating voltages required by said system.

96. The method for making a burn-in system according to claim 95 further comprising the step of providing system timing generation module means coupled to said system bus and coupled to a system timing bus and to a hold bus for providing programmable master and data clock signals required by said system.

97. The method for making a burn-in system according to claim 96 further comprising the step of providing vector hold module means coupled to said system bus, to said system timing bus and to said hold bus for altering said programmable master and data clock signals required by said system to extend the time interval of stored data patterns.

98. The method for making a burn-in system according to claim 97 further comprising the step of providing analog generation module means coupled to said system timing bus and to said system bus and to an analog bus for generating analog signals based on stored patterns.

99. The method for making a burn-in system according to claim 98 further comprising the step of providing analog driver module means coupled to said analog bus and to a driven analog bus for providing higher current drive capability to channels of said driven analog bus.

100. The method for making a burn-in system according to claim 99 further comprising the step of providing vector storage module means coupled to said system timing bus and to said system bus and to a vectors bus for retaining test vectors to be applied to devices under test.

101. The method for making a burn-in system according to claim 100 further comprising the step of providing tri-state control module means coupled to said system bus, to said system timing bus, to said DUT Vcc bus and to a tri-state bus and to a tri-state vectors bus for causing an output driver to be switched to a high impedance or disconnected state.

102. The method for making a burn-in system according to claim 101 further comprising the step of providing output driver module means coupled to said vectors bus, to said tri-state vectors bus and to a driven vectors bus for providing current amplification of test vectors transmitted on said vectors bus.

103. The method for making a burn-in system according to claim 102 further comprising the step of providing on-board status monitoring module means coupled to said vectors bus, to said tri-state bus, to said system bus and to said driven vectors bus for monitoring for faults in the various modules of said system.

104. The method for making a burn-in system according to claim 103 further comprising the step of providing DUT monitoring module means coupled to said system bus, to said system timing bus and to a DUT monitors bus for monitoring for operating failures in the devices being tested by said system.

105. The method for making a burn-in system according to claim 104 further comprising the step of providing automatic programming module means coupled to said system bus, to said system timing bus and to an automatic programming bus for translating the identification code of a burn-in board.

106. The method for making a burn-in system according to claim 105 further comprising the step of providing burn-in board means coupled to said driven analog bus, to said driven vectors bus, to said power bus, to said DUT monitors bus and to said automatic programming bus for housing devices to be tested.

107. A method for making a burn-in driver system comprising the steps of:
providing computer means for controlling said system;
providing computer interface module means coupled to said computer means via a bi-directional computer bus and coupled to a system bus for providing transceiver and select logic functions for data being transferred to and from said computer means via said system bus;
providing power management module means coupled to said system bus and coupled to a power bus, a DUT Vcc bus and an on-board power bus for measuring and regulating voltages required by said system;
providing system timing generation module means coupled to said system bus and coupled to a system timing bus and to a hold bus for providing programmable master and data clock signals required by said system;
providing vector hold module means coupled to said system bus, to said system timing bus and to said hold bus for altering said programmable master and data clock signals required by said system to extend the time interval of stored data patterns;
providing analog generation module means coupled to said system timing bus and to said system bus and to an analog bus for generating analog signals based on stored patterns;
providing analog driver module means coupled to said analog bus and to a driven analog bus for providing higher current drive capability to channels of said driven analog bus;
providing vector storage module means coupled to said system timing bus and to said system bus and to a vectors bus for retaining test vectors to be applied to devices under test;
providing tri-state control module means coupled to said system bus, to said system timing bus, to said DUT Vcc bus and to a tri-state bus and to a tri-state vectors bus for causing an output driver to be switched to a high impedance or disconnected state;
providing output driver module means coupled to said vectors bus, to said tri-state vectors bus and to a driven vectors bus for providing current amplification of test vectors transmitted on said vectors bus;
providing on-board status monitoring module means coupled to said vectors bus, to said tri-state bus, to said system bus and to said driven vectors bus for monitoring for faults in the various modules of said system;
providing DUT monitoring module means coupled to said system bus, to said system timing bus and to a DUT monitors bus for monitoring for operating failures in the devices being tested by said system;
providing burn-in board means coupled to said driven analog bus, to said driven vectors bus, to said power bus, to said DUT monitors bus and to said automatic programming bus for housing devices to be tested; and
providing automatic programming module means coupled to said system bus, to said system timing bus and to an automatic programming bus for translating a unique code identifying said burn-in board means;
said computer means dynamically modifying the sequence of test signals to said devices to be tested during burn-in in response to the translation of said unique code identifying said burn-in board means.

* * * * *